US008724408B2

(12) United States Patent
Ho et al.

(10) Patent No.: US 8,724,408 B2
(45) Date of Patent: May 13, 2014

(54) SYSTEMS AND METHODS FOR TESTING AND ASSEMBLING MEMORY MODULES

(75) Inventors: Lawrence Wai Cheung Ho, Mississauga (CA); Eric Sin Kwok Chiu, Mississauga (CA)

(73) Assignee: Kingtiger Technology (Canada) Inc., Markham, Ontario (CA)

( * ) Notice: Subject to any disclaimer, the term of this patent is extended or adjusted under 35 U.S.C. 154(b) by 143 days.

(21) Appl. No.: 13/306,617

(22) Filed: Nov. 29, 2011

(65) Prior Publication Data

US 2013/0135951 A1    May 30, 2013

(51) Int. Cl.
*G11C 7/00* (2006.01)

(52) U.S. Cl.
USPC ............................................. 365/200

(58) Field of Classification Search
USPC ............................................. 365/200
See application file for complete search history.

(56) References Cited

U.S. PATENT DOCUMENTS

| | | |
|---|---|---|
| 4,001,818 A | 1/1977 | Radichel et al. |
| 4,209,846 A | 6/1980 | Seppa |
| 4,240,143 A | 12/1980 | Besemer et al. |
| 4,379,259 A | 4/1983 | Varadi et al. |
| 4,426,688 A | 1/1984 | Moxley |
| 4,479,214 A | 10/1984 | Ryan |
| 4,484,329 A | 11/1984 | Slamka et al. |
| 4,821,238 A | 4/1989 | Tatematsu |
| 4,965,799 A | 10/1990 | Green et al. |
| 5,224,107 A | 6/1993 | Mattes |
| 5,375,228 A | 12/1994 | Leary et al. |
| 5,450,576 A | 9/1995 | Kennedy |
| 5,539,697 A | 7/1996 | Kim et al. |
| 5,588,112 A | 12/1996 | Dearth et al. |
| 5,612,965 A | 3/1997 | Michaelson |
| 5,619,430 A | 4/1997 | Nolan et al. |

(Continued)

FOREIGN PATENT DOCUMENTS

| | | |
|---|---|---|
| EP | 0704854 | 4/1996 |
| JP | 2005234744 | 9/2005 |

(Continued)

OTHER PUBLICATIONS

Hermann, A.L., Diagnostic Data Comparator, IBM Technical Disclosure Bulletin, IBM Corp. New York, vol. 24, No. 5, Oct. 1981, pp. 2591-2592.

(Continued)

*Primary Examiner* — Huan Hoang
*Assistant Examiner* — Min Huang
(74) *Attorney, Agent, or Firm* — Bereskin & Parr LLP/S.E.N.C.R.L., s.r.l.

(57) ABSTRACT

Embodiments described herein relate to systems and methods for testing and assembling memory modules. In at least one embodiment, the method comprises, for each memory device of a plurality of memory devices, based on testing performed on the memory device, determining whether the memory device has any defective memory locations, and if so, identifying the one or more defective memory locations, and generating data that identifies the one or more defective memory locations on the memory device; and assembling a memory module comprising at least one memory device having one or more defective memory locations; wherein the assembling comprises, for each memory device of the memory module having one or more defective memory locations, storing the data that identifies the one or more defective memory locations on the memory device in a persistent store on the memory module.

27 Claims, 11 Drawing Sheets

(56) References Cited

U.S. PATENT DOCUMENTS

| | | |
|---|---|---|
| 5,619,926 A | 4/1997 | Engelmann et al. |
| 5,666,482 A | 9/1997 | McClure |
| 5,671,229 A | 9/1997 | Harari et al. |
| 5,720,031 A | 2/1998 | Lindsay |
| 5,751,641 A | 5/1998 | Petrosino |
| 5,758,056 A | 5/1998 | Barr |
| 5,764,878 A | 6/1998 | Kablanian et al. |
| 5,774,647 A | 6/1998 | Raynham et al. |
| 5,794,175 A | 8/1998 | Conner |
| 5,844,913 A | 12/1998 | Hassoun et al. |
| 5,862,314 A | 1/1999 | Jeddeloh |
| 5,867,702 A | 2/1999 | Lee |
| 5,905,858 A | 5/1999 | Jeddeloh |
| 5,937,367 A | 8/1999 | Eckardt |
| 5,940,875 A | 8/1999 | Inagaki et al. |
| 5,959,914 A | 9/1999 | Gates et al. |
| 5,986,950 A | 11/1999 | Joseph |
| 5,995,424 A | 11/1999 | Lawrence et al. |
| 5,995,915 A | 11/1999 | Reed et al. |
| 5,996,096 A * | 11/1999 | Dell et al. ............... 714/710 |
| 6,002,623 A | 12/1999 | Stave et al. |
| 6,014,759 A | 1/2000 | Manning |
| 6,018,484 A | 1/2000 | Brady |
| 6,029,262 A | 2/2000 | Medd et al. |
| 6,035,432 A | 3/2000 | Jeddeloh |
| 6,052,798 A | 4/2000 | Jeddeloh |
| 6,055,653 A | 4/2000 | LeBlanc et al. |
| 6,055,661 A | 4/2000 | Luk |
| 6,058,055 A | 5/2000 | Brunelle |
| 6,085,334 A | 7/2000 | Giles et al. |
| 6,125,392 A | 9/2000 | Labatte et al. |
| 6,134,690 A | 10/2000 | Ivaturi et al. |
| 6,154,851 A | 11/2000 | Sher et al. |
| 6,158,025 A | 12/2000 | Brisse et al. |
| 6,173,382 B1 | 1/2001 | Dell et al. |
| 6,178,526 B1 | 1/2001 | Nguyen et al. |
| 6,237,110 B1 | 5/2001 | Lin et al. |
| 6,260,127 B1 | 7/2001 | Olarig et al. |
| 6,275,962 B1 | 8/2001 | Fuller et al. |
| 6,285,607 B1 | 9/2001 | Sinclair |
| 6,304,989 B1 | 10/2001 | Kraus et al. |
| 6,313,657 B1 | 11/2001 | Hashimoto |
| 6,324,657 B1 | 11/2001 | Fister et al. |
| 6,324,665 B1 | 11/2001 | Fay |
| 6,327,556 B1 | 12/2001 | Geiger et al. |
| 6,345,372 B1 | 2/2002 | Dieckmann et al. |
| 6,389,525 B1 | 5/2002 | Reichert et al. |
| 6,425,095 B1 | 7/2002 | Yasui |
| 6,430,720 B1 | 8/2002 | Frey et al. |
| 6,452,411 B1 | 9/2002 | Miller et al. |
| 6,460,152 B1 | 10/2002 | Demidov et al. |
| 6,499,117 B1 | 12/2002 | Tanaka |
| 6,499,120 B1 | 12/2002 | Sommer |
| 6,536,005 B1 | 3/2003 | Augarten |
| 6,546,511 B1 | 4/2003 | Sim et al. |
| 6,574,759 B1 | 6/2003 | Woo et al. |
| 6,600,614 B2 | 7/2003 | Lenny et al. |
| 6,601,183 B1 | 7/2003 | Larson et al. |
| 6,615,379 B1 | 9/2003 | Tripp et al. |
| 6,622,269 B1 | 9/2003 | Ngo et al. |
| 6,646,936 B2 | 11/2003 | Hamamatsu et al. |
| 6,701,474 B2 | 3/2004 | Cooke et al. |
| 6,708,298 B2 | 3/2004 | Corbin et al. |
| 6,728,907 B1 | 4/2004 | Wang et al. |
| 6,731,125 B2 | 5/2004 | Chang |
| 6,754,117 B2 | 6/2004 | Jeddeloh |
| 6,820,224 B1 | 11/2004 | Lin et al. |
| 6,851,076 B1 | 2/2005 | Cook, III et al. |
| 6,880,118 B2 | 4/2005 | Chen et al. |
| 6,888,366 B2 | 5/2005 | Kim et al. |
| 6,889,305 B2 | 5/2005 | Adelmann |
| 6,910,146 B2 | 6/2005 | Dow |
| 6,996,749 B1 | 2/2006 | Bains et al. |
| 7,010,452 B2 | 3/2006 | Gomes et al. |
| 7,065,630 B1 | 6/2006 | Ledebohm et al. |
| 7,085,980 B2 | 8/2006 | Martin-de-Nicolas et al. |
| 7,088,122 B2 | 8/2006 | Hartmann et al. |
| 7,092,902 B2 | 8/2006 | Eldridge et al. |
| 7,114,024 B2 | 9/2006 | Herbst |
| 7,119,567 B2 | 10/2006 | Ma et al. |
| 7,120,777 B2 | 10/2006 | Adelmann |
| 7,123,051 B1 | 10/2006 | Lee et al. |
| 7,131,046 B2 | 10/2006 | Volkerink et al. |
| 7,142,003 B2 | 11/2006 | Kanbayashi et al. |
| 7,155,370 B2 | 12/2006 | Nejedlo |
| 7,159,160 B2 | 1/2007 | Yoh et al. |
| 7,216,273 B2 | 5/2007 | Phelps et al. |
| 7,246,269 B1 | 7/2007 | Hamilton |
| 7,251,744 B1 | 7/2007 | Housty |
| 7,260,758 B1 | 8/2007 | Agrawal et al. |
| 7,269,765 B1 | 9/2007 | Charlton et al. |
| 7,272,758 B2 | 9/2007 | Roohparvar |
| 7,287,204 B2 | 10/2007 | Mayer et al. |
| 7,346,755 B2 | 3/2008 | Pomaranski et al. |
| 7,428,687 B2 | 9/2008 | Klein |
| 7,444,564 B2 | 10/2008 | Anand et al. |
| 7,447,955 B2 | 11/2008 | Niijima et al. |
| 7,478,285 B2 | 1/2009 | Fouquet-Lapar |
| 7,590,008 B1 | 9/2009 | Roge et al. |
| 7,603,595 B2 | 10/2009 | Sasaki |
| 7,694,195 B2 | 4/2010 | Khatri et al. |
| 7,783,919 B2 | 8/2010 | Khatri et al. |
| 7,848,899 B2 | 12/2010 | Lai et al. |
| 7,945,815 B2 | 5/2011 | Khatri et al. |
| 7,949,913 B2 | 5/2011 | Norrod et al. |
| 8,276,029 B2 | 9/2012 | Khatri et al. |
| 2001/0042225 A1 | 11/2001 | Cepulis et al. |
| 2002/0073353 A1 | 6/2002 | Fish et al. |
| 2002/0108072 A1 | 8/2002 | Beng Sim et al. |
| 2002/0120826 A1 | 8/2002 | Venkatraman et al. |
| 2002/0157048 A1 | 10/2002 | Roohparvar |
| 2002/0184445 A1 | 12/2002 | Cherabuddi |
| 2003/0005367 A1 | 1/2003 | Lam |
| 2003/0058711 A1 | 3/2003 | Benedix et al. |
| 2003/0095455 A1 | 5/2003 | Dono et al. |
| 2003/0145250 A1 | 7/2003 | Chin |
| 2003/0208654 A1 | 11/2003 | Krontz et al. |
| 2003/0226090 A1 | 12/2003 | Thayer |
| 2004/0034825 A1 | 2/2004 | Jeddeloh |
| 2004/0042293 A1 | 3/2004 | Ogino |
| 2004/0088614 A1 | 5/2004 | Wu |
| 2004/0186688 A1 | 9/2004 | Nejedlo |
| 2005/0022066 A1 | 1/2005 | Herbst |
| 2005/0060514 A1 | 3/2005 | Pomaranski et al. |
| 2005/0120270 A1 | 6/2005 | Anand et al. |
| 2005/0149687 A1 | 7/2005 | Adelmann |
| 2006/0004942 A1 | 1/2006 | Hetherington et al. |
| 2006/0059383 A1 | 3/2006 | Roohparvar |
| 2006/0236165 A1 | 10/2006 | Cepulis et al. |
| 2007/0061637 A1 | 3/2007 | Ward et al. |
| 2007/0101238 A1 | 5/2007 | Resnick et al. |
| 2007/0136385 A1 | 6/2007 | Abrashkevich et al. |
| 2007/0136625 A1 | 6/2007 | Niijima et al. |
| 2007/0140025 A1 | 6/2007 | Chan et al. |
| 2007/0147144 A1* | 6/2007 | Tokiwa ..................... 365/200 |
| 2007/0150777 A1 | 6/2007 | Sasaki |
| 2007/0174718 A1 | 7/2007 | Fouquet-Lapar |
| 2007/0217559 A1 | 9/2007 | Stott et al. |
| 2007/0260828 A1 | 11/2007 | Swaminathan et al. |
| 2008/0229143 A1 | 9/2008 | Muraki |
| 2008/0235505 A1 | 9/2008 | Hobson et al. |
| 2008/0247243 A1 | 10/2008 | Kang et al. |
| 2008/0301530 A1 | 12/2008 | Spanel |
| 2009/0049257 A1 | 2/2009 | Khatri et al. |
| 2009/0254777 A1* | 10/2009 | Feyt et al. .................... 714/37 |
| 2009/0300413 A1 | 12/2009 | Chang et al. |
| 2010/0251044 A1 | 9/2010 | Khatri et al. |

(56) References Cited

U.S. PATENT DOCUMENTS

2011/0305086 A1* 12/2011 Fujimura et al. ......... 365/185.09
2012/0075944 A1* 3/2012 Ide et al. ...................... 365/200

FOREIGN PATENT DOCUMENTS

| WO | 98/02816 | 1/1998 |
| WO | 99/05599 | 2/1999 |
| WO | 99/50748 | 10/1999 |
| WO | 0229824 | 4/2002 |

OTHER PUBLICATIONS

Co-pending U.S. Appl. No. 14/011,508, "Systems and Methods for Testing Memory", Filed Aug. 27. 2013.

* cited by examiner

SYSTEMS AND METHODS FOR TESTING AND ASSEMBLING MEMORY MODULES

TECHNICAL FIELD

The described embodiments relate to systems and methods for assembling memory modules, and more specifically, systems and methods for assembling memory modules using a plurality of individual memory devices.

BACKGROUND

The memory capacity of memory devices has significantly increased in recent years. Corresponding to this increase in memory capacity is a greater likelihood for memory devices to be manufactured with defective memory cells or for at least some memory cells of the memory device to become defective through use. Any defective memory cell in a memory device may, to varying degrees, negatively affect the operation of a computing device or other device that may employ the memory device for data storage.

Error correction schemes may be used to deal with single-bit errors or multi-bit errors resulting from memory defects that are detected during the operation of a computing system. Other schemes for handling memory errors detected during the operation of a computing system are also known.

For example, U.S. Pat. No. 7,694,195 describes a method of managing memory defects. Defective memory locations are detected in a scan operation during the startup of a computer system, and the memory defect information is stored in a memory defect map. Subsequently, these defective memory locations may be skipped during normal operating procedures.

U.S. Pat. No. 7,783,919 further describes detecting and handling memory errors during execution of a run time environment within a computer system. If it is determined that a memory error has occurred, memory locations on individual memory devices where the memory error occurred may be identified, and references to these memory locations can be stored in a persistent memory of a memory module. Moreover, U.S. Patent Publication No. 2010/0251044 discloses generating a memory map, wherein usable memory regions containing defective memory elements are excluded from the memory map.

BRIEF DESCRIPTION OF THE DRAWINGS

For a better understanding of embodiments of the systems and methods described herein, and to show more clearly how they may be carried into effect, reference will be made, by way of example, to the accompanying drawings in which.

DETAILED DESCRIPTION

Figure 1A:
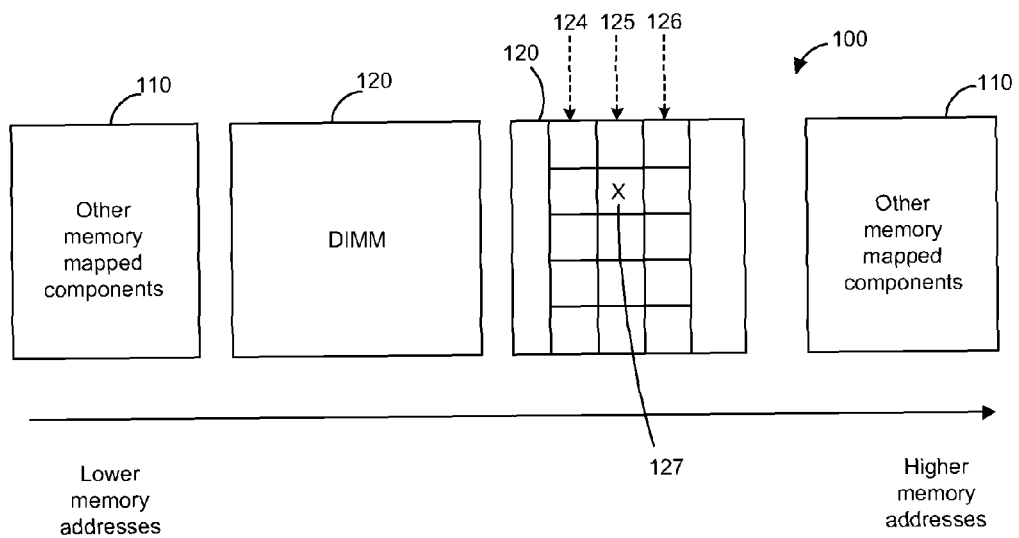
FIGS. 1a and 1b are block diagrams of a memory space in which at least one memory module is provided.

In contrast to methods and systems where defective memory locations on a memory device are identified using resources available on a computing system or other device that is employing the memory device while in operation, at least some embodiments described herein relate generally to systems and methods for managing defective memory devices during the testing and assembly of memory devices, which typically occurs prior to their actual use in the computing system where they are intended to be used.

By managing defective memory devices at the testing and assembly stage, this may provide greater control over the specific components used to assemble a memory module, for example.

By way of illustration, certain characteristics of memory devices may be determined from the testing results of each memory device or memory module. Example characteristics include the number of memory defects, and the locations of memory defects on the tested memory device or memory module.

Accordingly, when assembling a memory module from a plurality of memory devices that have been tested, a manufacturer is equipped with more information about each memory device, and may determine which tested memory devices are more suitable for a particular use, prior to their actual use. Memory defect data that is associated with a given memory device and obtained during testing may then be stored for future reference.

In particular, memory modules may be assembled from tested memory devices of which certain cells were determined to be defective. Information about the memory defects may be pre-loaded onto the memory modules before the memory modules are made available for use by a computing system. The computing system may, therefore, be made aware of the location of memory defects so that those locations may be skipped during operation, without the computing system itself having to devote resources to generate the memory defect data. The resources employed during the testing stage may also be more reliable in determining the memory defect data than the resources available on the computing system.

Furthermore, at least some embodiments herein may also allow memory devices that are not defect-free to nevertheless be used in the assembly of memory modules when they might otherwise be discarded after testing, for example.

In one broad aspect, there is provided a method of assembling memory modules, the method comprising: for each memory device of a plurality of memory devices, based on testing performed on the memory device, determining whether the memory device has any defective memory locations, and if the memory device has one or more defective memory locations, identifying the one or more defective memory locations, and generating data that identifies the one or more defective memory locations on the memory device; and assembling a memory module, the memory module comprising at least one memory device, of the plurality of memory devices, having one or more defective memory locations; wherein the assembling comprises, for each memory device of the memory module having one or more defective memory locations, storing the data that identifies the one or more defective memory locations on the memory device in a persistent store on the memory module.

In another broad aspect, the method further comprises selecting the at least one memory device from the plurality of memory devices for assembly into the memory module based on where the defective memory locations are located on each of the at least one memory device.

In another broad aspect, for each of the at least one memory device, the memory device is selected for assembly into the memory module if at least one of the defective memory locations on the memory device, and at least one of the defective memory locations on at least one different memory device of the at least one memory device, will belong to a same at least one memory block of the memory module after assembly of the memory module.

In another broad aspect, the persistent store on the memory module comprises a serial presence detect module.

In another broad aspect, the method further comprises: storing, for each memory device of the plurality of memory devices, the data that identifies the one or more defective memory locations on the memory device in a database; and retrieving, for each memory device of the memory module having one or more defective memory locations, the data that identifies the one or more defective memory locations on the memory device, from the database for storing in the persistent store on the memory module.

In another broad aspect, the method further comprises: generating, for each memory device of the plurality of memory devices, data that identifies details associated with the testing performed on the memory device; wherein assembling the memory module further comprises storing the data that identifies details associated with the testing performed on the memory device in the persistent store on the memory module.

In another broad aspect, the method further comprises: storing, for each memory device of the plurality of memory devices, the data that identifies the details associated with the testing performed on the memory device in a database; and retrieving, for each memory device of the memory module having one or more defective memory locations, the data that identifies the details associated with the testing performed on the memory device, from the database for storing in the persistent store on the memory module.

In another broad aspect, the details associated with the testing performed on the memory device comprise an identification of a test pattern that caused a failure of the memory device.

In another broad aspect, the memory module comprises at least one memory device having no defective memory locations.

In another broad aspect, each memory device of the memory module comprises the same number of defective memory locations.

In another broad aspect, each memory device of the memory module comprises exactly one defective memory location.

In another broad aspect, the memory module comprises eight memory devices.

In another broad aspect, the plurality of memory devices comprises eight or less defective memory locations, in total, amongst the plurality of memory devices.

In another broad aspect, the method further comprises testing each of the plurality of memory devices, wherein test vector patterns are utilized in the testing to determine defective memory locations on each of the plurality of memory devices.

In another broad aspect, the method further comprises retrieving the plurality of memory devices from a pool of tested memory devices.

In another broad aspect, the method further comprises sorting the plurality of memory devices into at least two groups prior to the retrieving, wherein memory devices having no defective memory locations are separated from the memory devices having one or more defective memory locations.

In another broad aspect, the sorting comprises separating the memory devices having one or more defective memory locations into at least one group associated with a pre-defined number of defective memory locations.

In another broad aspect, the sorting comprises separating the memory devices having a number of defective memory locations greater than a threshold value into a group, wherein memory devices having the number of defective memory locations greater than the threshold value are not used for assembling the memory module.

In another broad aspect, the sorting is performed with aid from a robotic device.

In another broad aspect, retrieving the plurality of memory devices from the pool of tested memory devices comprises selecting the plurality of memory devices from the pool of tested memory devices, such that all of the defective memory locations on the plurality of memory devices are located in a same at least one memory block.

In another broad aspect, the same at least one memory block is associated with at least one memory block address.

In another broad aspect, there is provided a system for testing and assembling memory modules, the system comprising: a tester, wherein the tester comprises a processor, and wherein the processor is configured to, for each memory device of a plurality of memory devices, based on testing performed on the memory device, determine whether the memory device has any defective memory locations, and if the memory device has one or more defective memory locations, identify the one or more defective memory locations, and generate data that identifies the one or more defective memory locations on the memory device; and wherein the system is further configured to assemble a memory module, the memory module comprising at least one memory device, of the plurality of memory devices, having one or more defective memory locations; wherein assembling the memory module comprises, for each memory device of the memory module having one or more defective memory locations, storing the data that identifies the one or more defective memory locations on the memory device in a persistent store on the memory module.

Figure 1B:
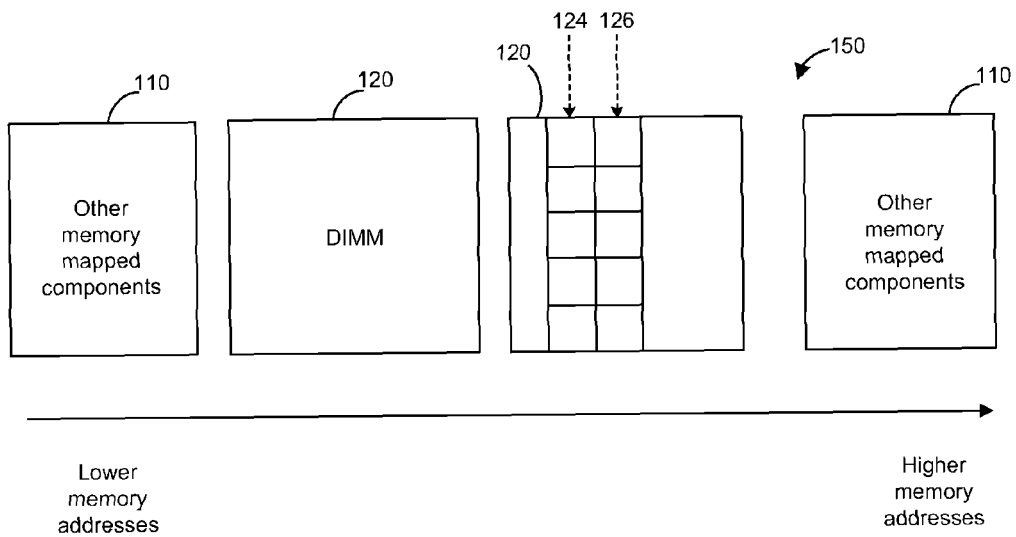

Reference is now made to FIGS. 1a and 1b. Shown therein are block diagrams of a memory space in which at least one memory module is provided.

FIG. 1a illustrates a block diagram of a memory space 100, comprising multiple memory components that are capable of being addressed as memory. Examples of memory components may include memory modules 120, shown as dual inline memory modules (DIMMs) in the Figures by way of illustration only, and other memory mapped components 110. It will be understood by persons skilled in the art that memory modules other than DIMMs may be employed in variant embodiments. A memory space may comprise multiple memory modules, and/or other memory components, of a single type or of different types.

By way of illustration, memory space 100 may be subject to a memory scanning operation that scans the memory in each memory device to analyze all addressable memory locations in succession. In FIG. 1a, for instance, memory blocks associated with memory block addresses 124, 125 and 126 respectively (in this example, the memory block associated with memory block address 125 contains a defective memory location 127 associated with one or more cells) may be scanned in succession. A "memory block" typically refers to a contiguous memory address space consisting of a row, a half-row, or some other grouping of memory cells within an individual memory device, on one or more memory devices.

In one known system, the memory scanning operation occurs during the startup of a computing system. The computing system may then create a memory map which excludes defective memory locations as determined from the memory scanning operation, or as determined from prior startup scans. Data identifying defective memory locations within a particular memory space may be stored in a persistent store on a memory module. The persistent store may be a Serial Presence Detect (SPD) device on the memory module, for example.

Continuing the example of FIG. 1a, FIG. 1b depicts a usable memory space 150, in which the memory block associated with memory block address 125 (FIG. 1a) has been excluded from the memory map after the defective memory location 127 (FIG. 1a) was detected during the startup scan.

Figure 2:
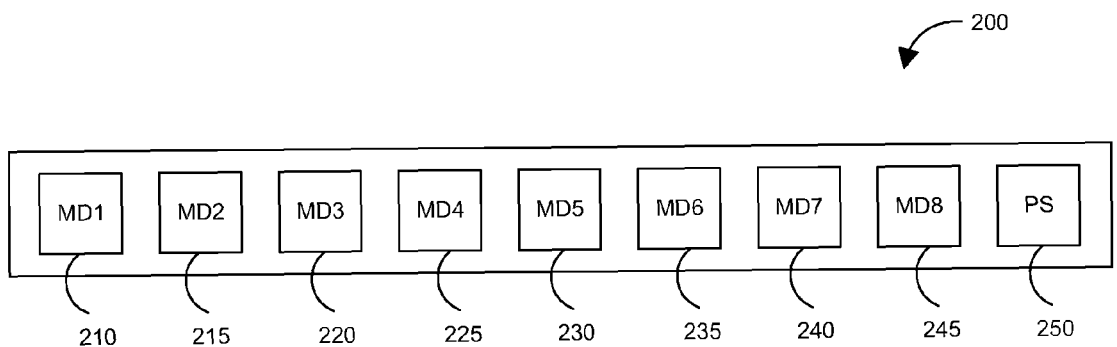
FIG. 2 is a block diagram of a memory module comprising multiple memory devices and a persistent store.

Reference is now made to FIG. 2, in which a block diagram of a memory module 200 is illustrated. Memory module 200 may be used in the provision of a memory space (e.g., memory module 200 may be provided as a memory module 120 in FIGS. 1a and 1b). Memory module 200 comprises multiple, individual memory devices (MD), such as, for example a first memory device (MD1) 210, a second memory device (MD2) 215, a third memory device (MD3) 220, a fourth memory device (MD4) 225, a fifth memory device (MD5) 230, a sixth memory device (MD6) 235, a seventh memory device (MD7) 240, an eighth memory device (MD7) 245, and a persistent store (PS) 250 in at least one embodiment. It will be understood by persons skilled in the art that a memory module 200 may comprise a greater or fewer number of memory devices, in variant implementations.

Memory module 200 may be scanned for memory errors. In one known system, a scan for memory errors is performed during the execution of a run time environment within a computer system. Memory locations on individual memory devices, such as one or more of MD1 210, MD2 215, MD3 220, MD4 225, MD5 230, MD6 235, MD7 240 and MD8 245, in which a memory error is detected, may be identified. Data identifying those memory locations can be stored in the persistent store 250 of the memory module 200. Memory locations in which a memory error is detected are also referred to herein as "defective" memory locations.

Figure 3:
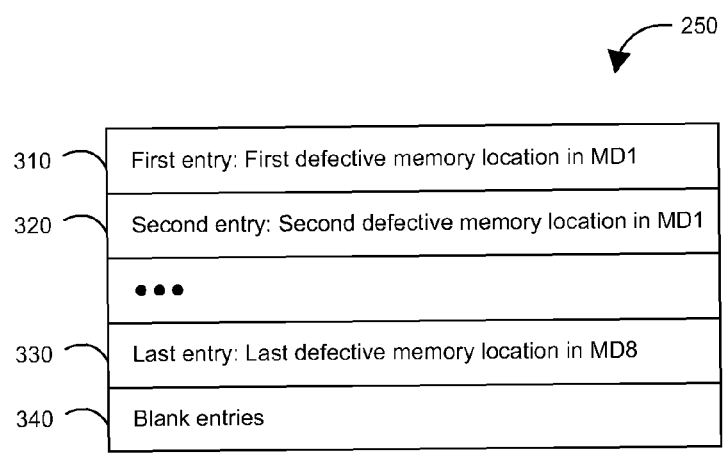
FIG. 3 illustrates data identifying defective memory locations as stored in the persistent store of FIG. 2.

FIG. 3 illustrates how data identifying defective memory locations in the memory module 200 of FIG. 2 may be stored in the persistent store 250 of FIG. 2. Data identifying defective memory locations may be recorded as updateable memory references in some implementations. In FIG. 3, showing example content of the persistent store 250, data identifying defective memory locations in the memory module 200 (FIG. 2) may include a first entry 310 identifying a first defective memory location in MD1 210, a second entry 320 identifying a second defective memory location in MD1 210, and other entries (not shown), before a last entry 330 identifying a defective memory location in MD8 245. The persistent store 250 may provide one or more blank entries 340, which may be updated if and when additional defective memory locations are later identified.

FIG. 3 is provided for illustrative purposes only. It will be understood that MD1 210 may have any number of defective memory locations (e.g., none, 1, 2, 3, or more), and the entries in persistent store 250 would differ from the illustration shown in FIG. 3 accordingly. Similarly, MD8 245 may have any number of defective memory locations (e.g., none, 1, 2, 3, or more), and the entries in persistent store 250 would differ from the illustration shown in FIG. 3 accordingly. Depending on the capacity of the persistent store 250 and the number of entries stored therein, blank entries 340 may or may not be available.

In accordance with at least one embodiment described herein, the data identifying defective memory locations 250 may originate from data stored in a database. The database may have been populated with data obtained during testing of memory devices prior to their assembly into memory modules for example, as discussed below.

Figure 4:
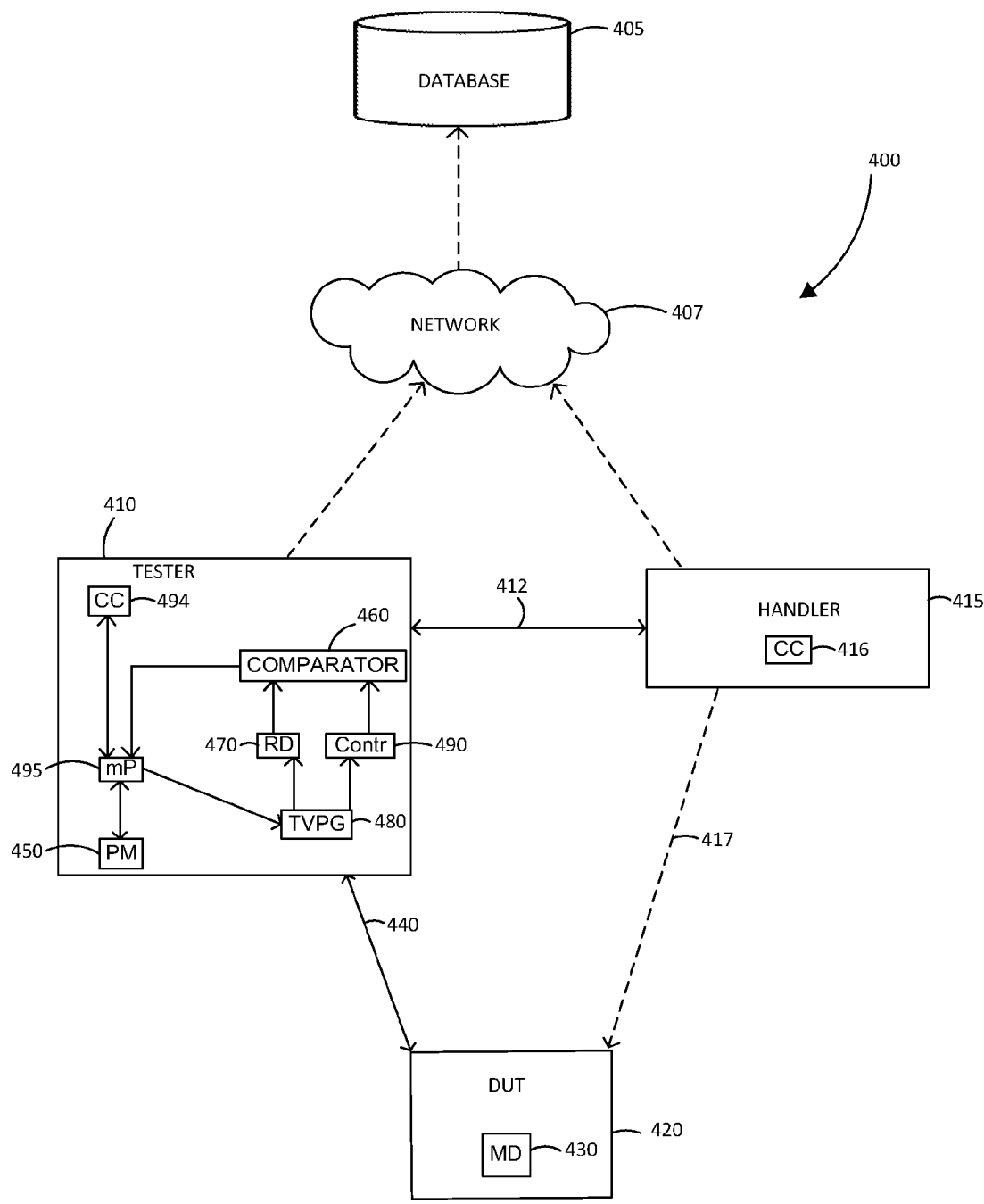
FIG. 4 is a block diagram of a test system configured to test a memory device in accordance with at least one example embodiment.

Referring now to FIG. 4, a block diagram is shown, which illustrates a test system 400 for performing testing on a memory device 430 in accordance with at least one example embodiment.

Typically, memory devices are tested and certified by manufacturers to ensure that signal parameters are within an allowable range set by the manufacturer or by corresponding appropriate standards. Complete testing of a memory device may include both functional testing as well as application-specific testing.

Specific to memory devices, functional testing generally tests whether or not a memory device performs particular functions properly and meets the manufacturer's specifications. For example, functional testing may test whether or not a digital value written to a cell of memory will later be retrieved without error, regardless of how the memory device is implemented. More specifically, memory devices may be subject to pattern testing, which is a method of exercising each memory device to verify its functionality with regards to certain test vector patterns.

Functional testing may also test whether or not certain critical operating characteristics of a memory device fall within an allowable range of values. Parametric tests verify critical operating characteristics, including characteristics such as, for example, power consumption, standby current, leakage current, voltage levels and access time. The allowable range may be set by the manufacturer of the memory device or by the corresponding appropriate standards.

While functional testing is generally oriented towards discovering whether or not a memory device under test is likely to fail during its intended use or application, it typically involves testing memory devices to verify how they execute a specific set of functions that are specially designed for this purpose.

Further testing of a memory device may also involve application-specific testing. During application-specific testing, memory devices may be subject to a testing of their system behavior in order to detect their behavioral failures. Behavioral failure is a type of failure that occurs when a memory device is operated within an actual application system. For example, a behavioral failure may be a failure that occurs as a result of a specific command or access sequence to a memory device that is performed in regular operations on a personal computer (PC).

Functional testing will not necessarily detect behavioral failures. With functional testing, the operation of a memory device under test does not need to be indicative of how the device will behave during its intended application. Accordingly, complete and comprehensive testing of a memory device may require application-specific testing in addition to functional testing.

Referring again to FIG. 4, the test system 400 generally includes a tester 410, a handler 415 and a device under test (DUT) 420. The tester 410 may be connected to the handler 415 via an interface 412. The tester 410 and the handler 415 may also be connected to a database 405 via a network 407 or by other means known to persons skilled in the art.

The tester 410 may include, for example, a program memory (PM) 450, a comparator 460, a test vector pattern generator (TVPG) 480, a controller (Contr) 490, a control computer (CC) 494, and a microprocessor (mP) 495. In practice, the functions of some of the elements shown logically in FIG. 4 may be integrated into one or more physical components. Where the DUT 420 includes at least one memory device (MD) 430, the tester 410 may also include a reference memory device (RD) 470.

Only certain electrical connections between the various components of the tester 410 and of the test system 400 are illustrated, for ease of exposition. However, it will be understood by persons skilled in the art that the tester 410 and/or test system 400 may include components or connections in addition to or as an alternative to one or more of the components or connections shown in FIG. 4.

In the example of FIG. 4, the tester 410 transmits signals to and receives signals from the DUT 420 via a communication channel 440.

In FIG. 4, the DUT 420 is illustrated to be a single memory device 430. However, it will be understood that the DUT 420 may comprise a plurality of memory devices, and the plurality of memory devices may belong to one or more memory modules. The testing of each of the plurality of memory devices may be performed consecutively or in parallel, for example. In variant embodiments, the DUT 420 may include one or more devices other than memory devices.

In at least one embodiment, the tester 410 and the handler 415 co-operate with each other during testing of the DUT 420. Each of the tester 410 and the handler 415 may be equipped with a control computer or other processing element (e.g. 494 and 416, respectively) configured, at least, to communicate test results. For example, the handler 415 may first load (by a mechanical means 417, such as for example, a robotic device) the DUT 420 into a testing unit (not shown) of the tester 410 to facilitate testing. The tester 410 performs testing on the DUT 420. Test results are processed by control computer (CC) 494. The control computer 494 in the tester may then send the test results to a control computer 416 in the handler, for example, via the interface 412. Based on the received test results, the control computer 416 in the handler may then determine where to physically move the tested memory device from the testing unit.

Some example operations of the tester 410 in relation to the DUT 420 are described in the paragraphs below. For example, testing may be performed on each individual memory cell of the memory device 430 so that if a given individual memory cell is determined to be defective (e.g. the memory cell failed a test carried out by the test system 400), its corresponding memory location may be identified.

To perform testing on the DUT 420, the microprocessor 495 may retrieve an instruction or instructions from the program memory 450. In response, the microprocessor 495 may instruct the TVPG 480 to generate a digital representation of a test vector pattern, which is then sent by the TVPG 480 to the controller 490. The test vector pattern may be utilized in the testing to determine defective memory locations on the DUT 420, which, in this example, is the memory device 430. Alternatively, the DUT 420 may comprise a plurality of memory devices.

Upon receipt of the test vector pattern generated by the TVPG 480, the controller 490 converts the test vector pattern into an electrical waveform. The controller 490 then outputs the electrical waveform to the DUT 420 via the communication channel 440. The TVPG 480 also sends a digital representation of the test vector pattern to the reference memory device 470 for temporary storage, to be used at a later stage in the testing procedure. In variant embodiments, a reference memory module comprising multiple memory devices may be employed instead of a reference memory device 470, particularly where the DUT 420 comprises multiple memory devices, for example.

The electrical waveform is transmitted electrically across the communication channel 440 to the DUT 420 and is sampled back into digital form. At some point after the electrical waveform has been transmitted to the DUT 420 by the controller 490, the DUT 420 electrically transmits, across the communication channel 440, a response data signal containing a response bit pattern for each memory device of the DUT 420, namely the memory device 430 illustrated in FIG. 4 in this example. An appropriate component or module thereon, which is not shown, may be configured to convert the response data signal from the DUT 420 from its digital form to an electrical waveform.

The controller 490 then converts the response data signals from the DUT 420 into digital form. The response data signals include the response data signals generated by the memory device 430 which are dependent on the test vector pattern sent by the controller 490 as an electrical waveform to the DUT 420.

The controller 490 then relays the converted response data signal from the DUT 420 to the comparator 460. At the comparator 460, the response data signal from the DUT 420 is compared with a digital form of a reference signal (i.e., a reference bit pattern, also generally referred to as an expected bit pattern), namely the signal that the controller 490 expects to receive from the DUT 420 that sent the response data signal. In one embodiment, the previously stored reference signal is transmitted to the comparator 460 by the reference memory device 470. The comparator 460 determines whether or not the response data signal is an identical match, based on a digital comparison, to the corresponding reference signal, and outputs that logical determination to the microprocessor 495.

If the comparator 460 determines a digital match between the two compared signals (i.e., between the response data signal and the corresponding reference signal), then the DUT 420 has, at least in the context of that particular test vector pattern, produced valid data. Where the DUT 420 is not determined to have undergone failure during testing and is determined to have met all required specifications, the DUT 420 may be considered a "good" or "defect-free" memory device.

However, if the comparator 460 determines that the two compared signals are not digitally identical, then the DUT 420 may have undergone a failure of some kind. As previously described, testing is performed on each individual memory cell on the memory device 430. Therefore, after the comparator 460 determines that the DUT 420 has undergone a failure, the one or more memory locations on the memory device where the failure occurred may be identified and those one or more memory locations are deemed to be "defective". Data that identifies the one or more defective memory locations on the memory device, once generated, may be stored.

For example, the data that identifies the one or more defective memory locations on the memory device may be stored in a database 405. This database 405 may reside on a computer system that may be external to, or within or coupled to the tester 410. If the database 405 is external to the tester 410, the database may be accessible via a network 407, for example.

Each entry associated with a defective memory location in the database 405 may comprise, for example, a memory device identification number, in addition to data identifying the actual memory location on the memory device. Optionally, other details describing a failure of the DUT 420 during testing (e.g., the technical characteristics of the DUT or the test pattern that caused the failure of the DUT) may also be recorded in the database 405. Further, information associated with the handler 415 may also be stored in the database 405, such as data identifying the handler used in the testing process (e.g., if multiple handlers are used), and data identifying the location in which the handler placed the memory device for testing (e.g., a test socket identifier). Also, information associated with the tester 410 may also be stored in the database 405, such as data identifying the tester used in the testing process (e.g., if multiple testers are used).

As described herein, in accordance with at least one embodiment, the database 405 may be used to store, for each memory device of a plurality of memory devices, data that identifies one or more defective memory locations on the memory device, for subsequent recording onto a persistent store on a memory module. Other data obtained from the database 405, such as operating parameters for the memory devices (e.g., Joint Electron Devices Engineering Council (JEDEC) memory standards) and manufacturer-specific parameters or data, for example, may also be stored in the persistent store on the memory module.

In at least one embodiment, a tested memory device, or alternatively, a plurality of tested memory devices, may be sorted, after testing, into at least two groups. For example, memory devices determined to have no defective memory locations may be separated from memory devices determined to have one or more defective memory locations. The memory devices determined to have no defective memory locations may be classified as "good" or "defect-free" memory devices, whereas the memory devices determined to have one or more defective memory locations may be generally classified as "bad" or at least partially "defective" memory devices. However, as previously noted, a memory device that has been classified as "bad" may still be rendered useful by identifying the defective memory locations in a persistent store on a memory module that would subsequently allow a computing device to "skip" those defective memory locations during operation, for example.

Memory devices having one or more defective memory locations may be further classified by memory device characteristics, such as, for example, whether or not a threshold number of defective memory locations is exceeded and/or whether there is memory leakage (e.g., when an error in a given cell is detected only if the memory cells surrounding the given cell take on particular values). If the threshold number of defective memory locations is exceeded, for example, the memory device may be discarded.

Figure 5A:
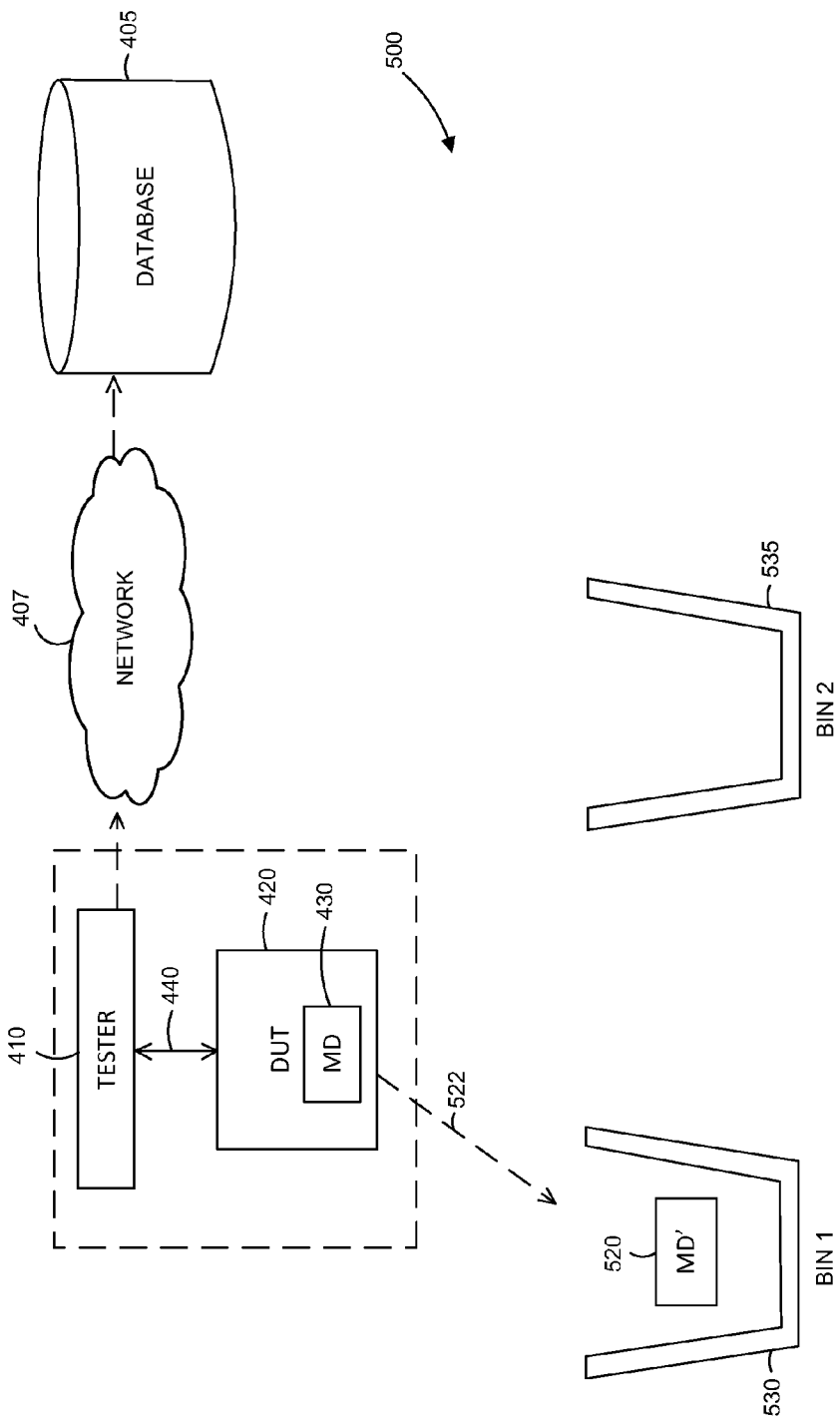
FIGS. 5a and 5b are block diagrams illustrating a process of sorting tested memory devices in accordance with at least one example embodiment.
Figure 5B:
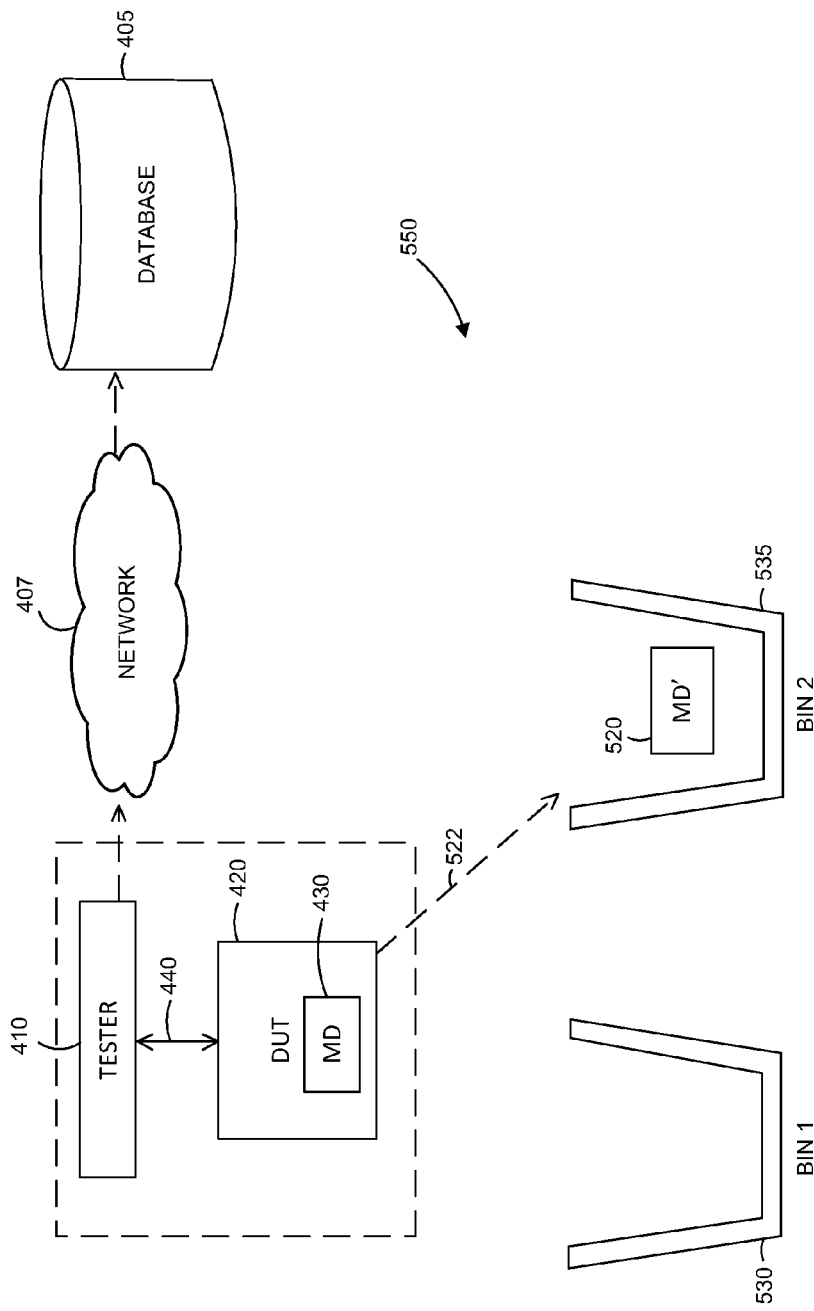

Referring now to FIGS. 5a and 5b, block diagrams 500, 550 illustrating a process of sorting tested memory devices in accordance with at least one example embodiment are shown.

In accordance with at least one example embodiment, FIG. 5a illustrates a tested memory device (depicted as MD') 520 being placed into one of two groups (as shown at 522). For example, tested memory devices may be sorted into bins, such as Bin 1 530 and Bin 2 535 by way of illustration, after undergoing testing by the tester 410.

In FIG. 5a, the tested memory device MD' 520 is placed by the handler 415 into Bin 1 530. For the purpose of this example, Bin 1 530 is designated to be where tested memory devices with no defective memory locations are stored, whereas Bin 2 535 is designated to be where tested memory devices with one or more defective memory locations are to be stored.

As illustrated in FIG. 5b, the tested memory device MD' 520 may instead be placed into Bin 2 535 (as shown at 522). In this example, the tested memory device MD' 520 is placed by the handler 415 into Bin 2 535 after determining that the tested memory device has one or more defective memory locations.

The term "bin" is used generally herein to define any logical or physical mechanism usable to group memory devices together, and different containers may be employed in variant implementations. It will be further understood that each of the illustrated bins may be designated to receive memory devices of the same type within a particular testing period. Generally, each bin may be used to collect tested memory devices of the same type and with similar testing results.

In variant embodiments, memory devices determined to have one or more defective memory locations may be sorted based on the number of defective memory locations. There may be a number of ways of defining multiple groups based on the number of defective memory locations. For example, memory devices having a number of defective memory locations greater than or equal to a certain threshold value may be separated into their own group, so that they may be discarded. The remaining memory devices having a number of defective memory locations less than the threshold value may be sorted into at least one other group. Some groups may be defined for memory devices having a specific number of defective memory locations (e.g., 1, 2, or 3 defective memory locations, etc.) or a range thereof (e.g., 1-2 and 3-4, or 1-3 and 4-6 defective memory locations, etc.).

Furthermore, in some embodiments, tested memory devices determined to have one or more defective memory locations may be sorted based on the memory block within which they are found. For example, a plurality of memory devices with one or more defective memory locations within a memory block that will correspond to the same memory block address within the memory module (and optionally, for example, within memory blocks that will correspond to neighboring memory block addresses) may be grouped together.

Figure 6:
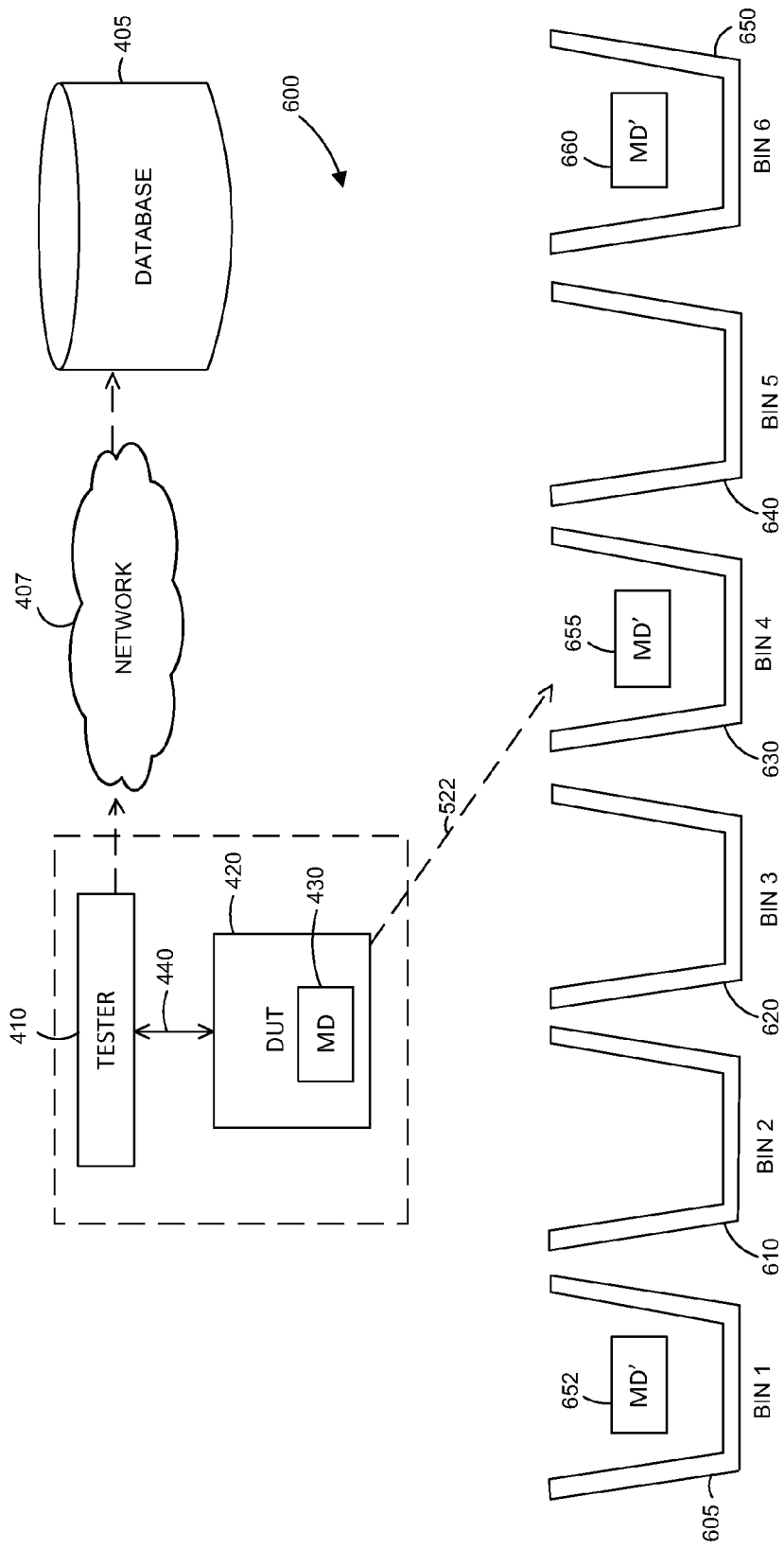
FIG. 6 is a block diagram illustrating a process of sorting tested memory devices in accordance with at least one example embodiment.

FIG. 6 illustrates an example process of sorting tested memory devices MDs 652, 655, and 660 into one of six different bins: Bin 1 605, Bin 2 610, Bin 3 620, Bin 4 630, Bin 5 640 and Bin 6 650. For ease of reference, six groups (e.g. defined by six corresponding bins) are illustrated in this example. However, as previously noted, it will be understood that a greater or fewer number of groups may be used.

Each bin illustrated in FIG. 6 may be designated for a group of memory devices with a specific number (or range of numbers) of defective memory locations. For example, Bin 1 605 may be designated for tested memory devices with no defective memory locations (e.g. the tested memory device 652), Bin 2 may be designated for tested memory devices with one defective memory location, Bin 3 may be designated for tested memory devices with two defective memory locations, Bin 4 may be designated for tested memory devices with three defective memory locations (e.g. the tested memory device 655), Bin 5 may be designated for tested memory devices with four defective memory locations, and Bin 6 may be designated for tested memory devices with five or more defective memory locations (e.g. the tested memory device 660).

In an alternative configuration, Bin 1 605 may be designated for tested memory devices with no defective memory locations, Bin 2 may be designated for tested memory devices with one defective memory location, Bin 3 may be designated for tested memory devices with two defective memory locations, Bin 4 may be designated for tested memory devices with three or four defective memory locations, Bin 5 may be designated for tested memory devices with five, six or seven defective memory locations, and Bin 6 may be designated for tested memory devices with eight or more defective memory locations. If the threshold number of defective memory locations before a memory device is to be subject to discard is defined as eight, the memory devices that are sorted into Bin 6 650 may be marked for discard and not used for assembling a memory module, in this example.

As a further example, tested memory devices may be separated into three groups or bins. A first bin may be designated for tested memory devices determined to have no defective memory locations, a second bin may be designated for tested memory devices determined to have a number of defective memory locations greater than a threshold value, and a third bin may be designated for tested memory devices with one or more defective memory locations, but where the number of defective memory locations is less than the threshold value. For example, if the threshold value for defective memory locations is 10, tested memory devices determined to have 10 or more defective memory locations would be sorted into the second bin, whereas tested memory devices determined to have between one and nine defective memory locations would be sorted into the third bin.

It will, however, be understood that the threshold value may differ in variant embodiments. In some embodiments, no threshold value may be defined.

As a further example, tested memory devices may be separated into bins based on defective memory locations in a given device being within one or more specific rows or columns of memory cells, where the specific rows or columns may be associated with one or more specific memory block addresses. For example, a given device may possess 1024 rows of memory cells. A first bin may be designated for the tested memory devices with no defective memory locations, a second bin may be designated for the tested memory devices with defective memory locations in any of rows 1-128 of memory cells of the given device, a third bin may be designated for the tested memory devices with defective memory locations in any of rows 129-256 of memory cells of the given device, and so on.

It will be understood that the number of bins to be utilized may differ in variant embodiments. It will also be understood that other criteria for sorting tested memory devices may be employed in variant embodiments. For example, in variant embodiments, tested memory devices may be sorted based on variations in voltage, timing parameters or frequency parameters associated with the testing of the memory devices.

It will also be understood that the selection of tested memory devices for assembly into a memory module may not require that tested memory devices be initially sorted into final groupings. Different and successive sorting techniques may be alternatively employed. For example, the tested memory devices may first be sorted based on a number of defective memory locations and then, each group of tested memory devices may then be further sorted based on certain defective memory locations being within certain groups of memory cells that will correspond to the same memory block address within the memory module (or neighboring memory block addresses). As previously noted, a memory block can span multiple memory devices. Conversely, the memory devices determined to have one or more defective memory locations may first be sorted based on the memory block addresses within which the defective memory locations are found, before being further sorted based on the number of defective memory locations.

In a further example, tested memory devices may not be pre-sorted into groups at all prior to assembly into memory modules.

In at least one embodiment, sorting may be performed with the assistance of a robotic device.

After memory devices have been tested and optionally sorted, and testing data is stored in the database (e.g., database 405 of FIG. 4), the memory devices may then be retrieved for assembly into one or more memory modules. If desired, the assembly may commence only after a sufficient number of memory devices have been tested, for example. In at least one embodiment, a plurality of memory devices may be retrieved from a pool comprising one or more groups of tested memory devices (e.g., from one or more bins) for assembly into one or more memory modules.

In at least one embodiment, the plurality of memory devices retrieved from the pool of tested memory devices may be selected such that all of the defective memory locations on the plurality of memory devices for a given memory module are located within the same memory block that corresponds to a particular memory block address, or within memory blocks that correspond to a particular group of neighboring memory block addresses.

When assembling a memory module, any number of memory devices may be used. Typically, the memory module will be assembled according to a standard configuration (e.g., using eight memory devices each storing eight bits of data, or using sixteen memory devices each storing four bits of data, etc.). In the methods and systems described herein, a memory module may be assembled using a plurality of memory devices, at least one of which is a memory device with one or more defective memory locations. Each one of the plurality of memory devices may be tested by the tester 410 (FIG. 4) in accordance with a testing procedure previously described herein, for example.

The assembly of memory modules may be performed with the aid of one or more mechanical machines or devices, and may involve the application of chemical processes, for example.

After a given memory module is assembled, the memory module may be subject to further testing. Information (which may include data identifying defective memory locations) pertaining to any memory defects that are identified after the memory module is assembled but that were not previously identified during the testing of the individual memory devices of the memory module may also be stored in a database (e.g., database 405 of FIG. 4) and/or in a persistent store provided on the memory module.

Figure 7:
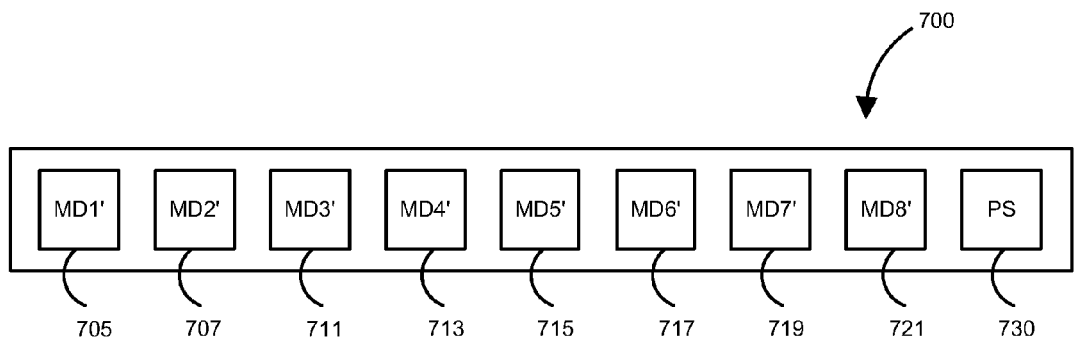
FIG. 7 is a block diagram of a memory module assembled with tested memory devices in accordance with at least one example embodiment.

By way of example, FIG. 7 is a block diagram of a memory module 700 assembled with tested memory devices in accordance with at least one example embodiment. The memory module 700 is assembled from eight tested memory devices: MD1' 705, MD2' 707, MD3' 711, MD4' 713, MD5' 715, MD6' 717, MD7' 719 and MD8' 721. Memory module 700 further comprises a persistent store (PS) 730.

In at least one embodiment, the persistent store 730 on the memory module 700 may be an SPD module or device. The SPD may be used to store characteristics of the memory module, such as for example, manufacturer data, date code data, timing parameters, operating parameters (e.g., according to the JEDEC standards), supporting parameters, etc.

In a variant embodiment, characteristics of an assembled memory module may be stored in a database. For example, data identifying defective memory locations in tested memory devices stored in the database 405 (FIG. 4) may be transferred for convenience into another database that may store, for example, data associated with tested memory devices assembled into memory modules. This other database may also store other characteristics of assembled memory modules as herein described, and other data associated with the testing and assembly processes (e.g., data identifying the devices used and the production line employed to assemble the memory modules).

Figure 8:
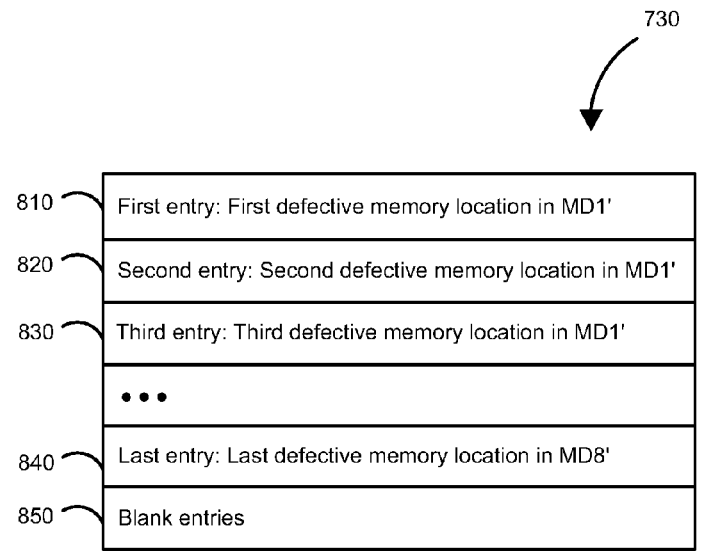
FIG. 8 illustrates data identifying defective memory locations in tested memory devices as stored in a persistent store in accordance with at least one example embodiment.

In at least one embodiment, data identifying defective memory locations in tested memory devices may be stored in the persistent store 730 as updateable memory references. For example, FIG. 8 generally illustrates data identifying defective memory locations in tested memory devices as stored in persistent store 730 in accordance with at least one example embodiment. The data identifying defective memory locations in tested memory devices may include a first entry 810 identifying a first defective memory location in the first tested memory device MD1' 705, a second entry 820 identifying a second defective memory location in the first tested memory device MD1' 705, a third entry 830 identifying a third defective memory location in the first tested memory device MD1' 705, and so on, depending on the number of defective memory locations determined to be within each of the tested memory devices assembled in the memory module. Finally, the data identifying defective memory locations in tested memory devices may include a last entry 840 identifying a last defective memory location in the eighth tested memory device 721. The data identifying defective memory locations in tested memory devices may, depending on the capacity of persistent store 730 and the number of entries corresponding to the identified error locations, further include one or more blank entries 850 that can be updated to store additional defective memory locations that may later be discovered. The later discovered and identified defective memory locations may, for example, be added by the tester 410 (e.g., that may be used to perform additional testing on the assembled memory module), or by a computer system or device when the memory module is subsequently deployed for use on the computer system or device.

In at least one embodiment, data identifying the one or more defective memory locations in each of the tested memory devices may be retrieved from a database (e.g., database 405 of FIG. 4 and/or the database used to store characteristics of an assembled memory module described herein), prior to storage in the persistent store 730 of the memory module 700.

Referring again to FIG. 7, by way of more specific examples, the eight tested memory devices (MDs') 705, 707, 711, 713, 715, 717, 719 and 721 may be assembled as to have, in total, eight or less defective memory locations.

For example, each of the eight tested memory devices 705, 707, 711, 713, 715, 717, 719 and 721 may each have the same number of defective memory locations in an assembled memory module 700. For example, each of the eight tested memory devices 705, 707, 711, 713, 715, 717, 719 and 721 in the assembled memory module 700 may have one defective memory location. In accordance with one embodiment, this memory module may be assembled by retrieving eight tested memory devices from a bin associated with the group of tested memory devices comprising a single defective memory location. Each of the defective memory locations on each of the eight tested memory devices 705, 707, 711, 713, 715, 717, 719 and 721 may be identified using data that is stored in the persistent store 730. This data may be retrieved from a database (e.g., database 405 and/or other database that stores data associated with assembled memory modules).

Figure 9:
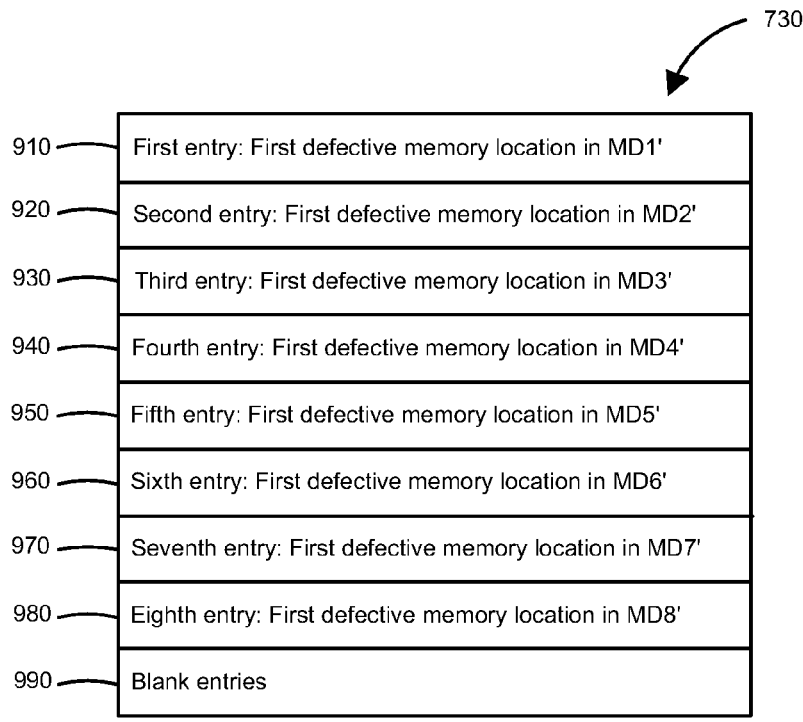
FIG. 9 illustrates data identifying defective memory locations in tested memory devices as stored in a persistent store in accordance with another example embodiment.

FIG. 9 illustrates data identifying defective memory locations in tested memory devices stored in persistent store 730 in accordance with the example described above. In the example where each of the eight tested memory devices 705, 707, 711, 713, 715, 717, 719 and 721 in the memory module 700 has one defective memory location, the corresponding data identifying defective memory locations in tested memory devices stored in persistent store 730 of the assembled memory module 700 may comprise a first entry 910 identifying a first defective memory location in the first tested memory device MD1' 705, a second entry 920 identifying a first defective memory location in the second tested memory device MD2' 707, a third entry 930 identifying a first defective memory location in the third tested memory device MD3' 711, a fourth entry 940 identifying a first defective memory location in the fourth tested memory device MD4' 713, a fifth entry 950 identifying a first defective memory location in the fifth tested memory device 715, a sixth entry 960 identifying a first defective memory location in the sixth tested memory device 717, a seventh entry 970 identifying a first defective memory location in the seventh tested memory device MD7' 719, and an eighth entry 980 identifying a first defective memory location in the eighth tested memory device MD8' 721. The data identifying defective memory locations in tested memory devices may further include one or more blank entries 990, updateable to store data associated with additional defective memory locations that are later discovered and identified.

Figure 10:
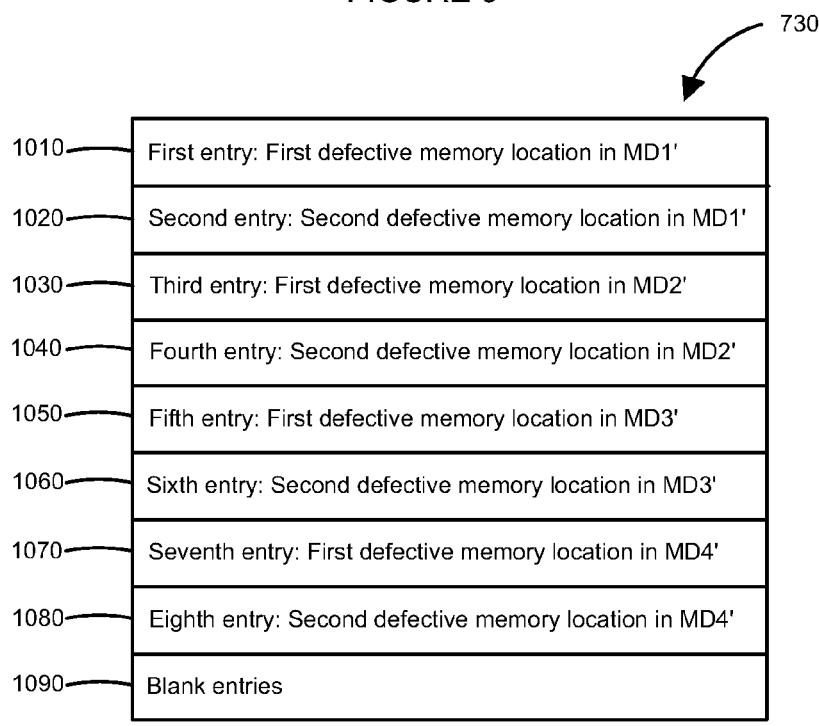
FIG. 10 illustrates data identifying defective memory locations in tested memory devices as stored in a persistent store in accordance with another example embodiment.

As a further example, four of the tested memory devices in the assembled memory module may each have two defective memory locations while the remaining four tested memory devices in the assembled memory module may each have no defective memory locations. FIG. 10 illustrates data identifying defective memory locations in tested memory devices stored in persistent store 730 in accordance with this example. The memory module may be assembled by retrieving four tested memory devices from a bin designated for a group of tested memory devices with two defective memory locations, and four tested memory devices from a bin designated for a group of tested memory devices with no defective memory locations. The corresponding data identifying defective memory locations in tested memory devices that may be stored in the persistent store 730 of the assembled memory module 700 may comprise a first entry 1010 identifying a first defective memory location in the first tested memory device MD1' 705, a second entry 1020 identifying a second defective memory location in the first tested memory device MD1' 705, a third entry 1030 identifying a first defective memory location in the second tested memory device MD2' 707, a fourth entry 1040 identifying a second defective memory location in the second tested memory device MD2' 707, a fifth entry 1050 identifying a first defective memory location in the third tested memory device MD3' 711, a sixth entry 1060 identifying a second defective memory location in the third tested memory device MD3' 711, a seventh entry 1070 identifying a first defective memory location in the fourth tested memory device MD4' 713, and an eighth entry 1080 identifying a second defective memory location in the fourth tested memory device MD4' 713. The data identifying defective memory locations in tested memory devices may further include one or more blank entries 1090, updateable to store data associated with additional defective memory locations that are later discovered and identified.

As a further example, the eight tested memory devices may be assembled so that two of the tested memory devices in the assembled memory module may each have four defective memory locations while the remaining six tested memory devices in the assembled memory module may each have no defective memory locations. As a further example, the memory module may be assembled so that one of the tested memory devices has eight defective memory locations while the remaining seven tested memory devices in the assembled memory module each have no defective memory locations.

All of these examples described herein are provided for the illustrative purposes, and it will be understood that other distributions of defective memory locations among tested memory devices of an assembled memory module are possible in variant implementations.

As previously noted, in at least one embodiment, a memory module may be assembled with tested memory devices such that defective memory locations, if any, are located within the same memory block that corresponds to a particular memory block address within the memory module, or within memory blocks that correspond to a particular group of neighboring memory block addresses.

Figure 11A:
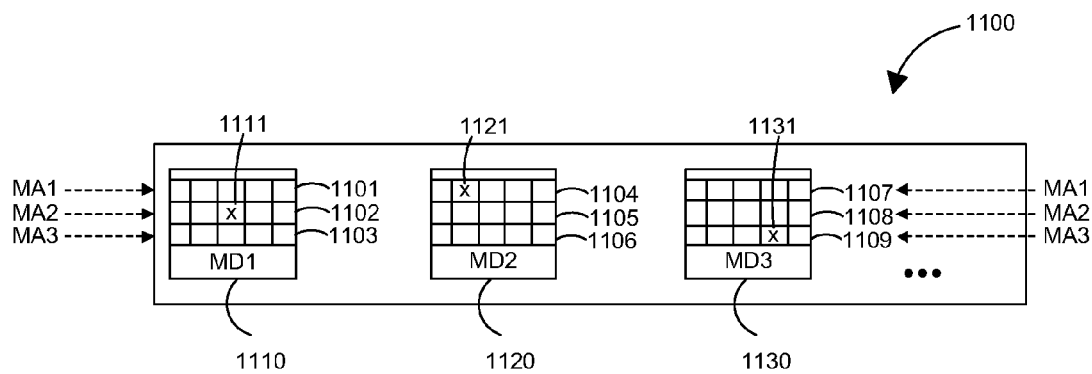
FIGS. 11a and 11b are block diagrams of memory modules used for illustrating a method of assembling a memory module from tested memory devices in accordance with at least one example embodiment.
Figure 11B:
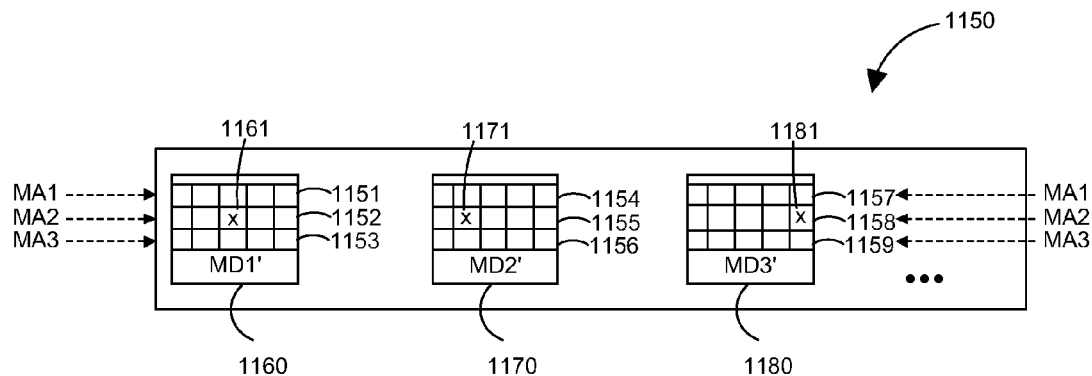

Referring now to FIGS. 11a and 11b, block diagrams of memory modules used to illustrate a method of assembling tested memory devices in accordance with at least one example embodiment are provided.

Groups of memory cells across different memory devices of a memory module may constitute a contiguously addressable memory block. Accordingly, when a memory module is in use, memory cells (e.g., a row, or a half-row, or other grouping) on each of multiple memory devices of the memory module may be accessed (e.g. read from or written to) in parallel. Typically, every individual memory device of a memory module will be accessed during any given memory operation in parallel; however, it is possible that only a strict subset of memory devices of the memory module might be accessed in parallel during a memory operation in certain implementations.

In accordance with an example memory management scheme, in response to each memory access request (e.g. read, write) to specific cells associated with the memory block address, data on each memory device of a memory module may be accessed in parallel from memory locations associated with that particular memory block address. Memory locations on multiple memory devices may be accessed even if the request relates to data that is to be read from or written to a particular memory device.

For example, for a memory module comprising eight memory devices, a memory address directed to a byte on this memory module can be represented by a 23-bit value. Bits 0-2 of the memory address may be used to identify a specific one of the eight memory devices, bits 3-12 may be used to designate a column address, and bits 13-22 may be used to designate a row address.

During a read operation where a memory controller is asked by the microprocessor to read a byte on the memory module at a particular memory address, the memory controller identifies bits 3 to 22 to the memory module; however, bits 0-2 are withheld. Accordingly, the memory controller will receive from the memory module not one, but eight consecutive bytes of data—one byte of data from each of the eight memory devices. The memory controller may then identify the requested byte (by then considering the value of bits 0-2 of the memory address), determines which byte of data is being requested, and returns the requested byte of data to the microprocessor. The other seven bytes of data that were simultaneously retrieved with the requested byte may be discarded or temporarily stored (e.g., in a cache). During a write operation where a memory controller is asked by the microprocessor to write a byte to the memory module at a particular memory address, all eight memory devices may also be simultaneously accessed. The memory controller provides the memory module with the byte of data to be written to the desired memory device, along with seven other (e.g., arbitrary) bytes that are "masked" (i.e., not actually written to the memory). Therefore, only the data at the desired memory device is overwritten.

Different portions of what is considered a contiguously addressable "memory block" will generally be distributed over each and every memory device in a memory module (although it may be possible in certain implementations that different memory block portions will be distributed over fewer memory devices of the memory module). A contiguously addressable memory block can be associated with a unique memory block address. Ultimately, when accessing memory according to this memory arrangement scheme, data on multiple devices of a memory module will typically be accessed in parallel even when data from only one particular memory device may be desired at a particular time, in order to reduce the memory access time. In anticipation of the future memory accesses, it may be more efficient to retrieve data in advance from the corresponding rows of memory cells across all memory devices corresponding to a memory block and to temporarily cache some data.

For example, in the example of FIG. 11a, a memory module 1100 is assembled from at least three memory devices, MD1 1110, MD2 1120, and MD3 1130. It will be generally understood that a memory module may generally comprise a fewer or greater number of memory devices than the number shown in the Figures. In this example, each of the memory devices MD1 1110, MD2 1120, and MD3 1130 are of the same type.

In FIG. 11a, three contiguously addressed memory blocks of memory module 1100 are illustrated, and each of the memory blocks corresponds to a different memory block address, namely MA1, MA2 and MA3. More specifically, the memory block associated with memory block address MA1 comprises a memory block portion 1101 on device MD1 1110, a memory block portion 1104 on device MD2 1120, and a memory block portion 1107 on device MD3 1130. The memory block associated with memory block address MA2 comprises a memory block portion 1102 on device MD1 1110, a memory block portion 1105 on device MD2 1120, and a memory block portion 1108 on device MD3 1130. The memory block associated with memory block address MA3 comprises a memory block portion 1103 on device MD1 1110, a memory block portion 1106 on device MD2 1120, and a memory block portion 1109 on device MD3 1130, and so on.

In this example, a defective memory location (such as for example, a memory cell) has been identified in each of the memory devices, namely 1111, 1121, and 1131 (depicted by an 'X' in FIG. 11*a*), in each of memory devices 1110, 1120 and 1130 respectively.

As shown in FIG. 11*a*, the defective memory locations are located at memory cells within different memory blocks, associated with different memory block addresses. For example, the defective memory location 1111 in MD1 is in a memory block associated with memory block address MA2, the defective memory location 1121 in MD2 is in a memory block associated with memory block address MA1, and the defective memory location 1131 in MD3 is in a memory block associated with memory block address MA3.

Consider that defective memory locations may be situated randomly within a given memory device, and the defective memory locations may also be distributed randomly as between different memory devices in a given memory module that is assembled using randomly selected memory devices.

Therefore, in this example, when access to any memory cell located in the memory block associated with memory block address MA1 is attempted, data will actually be accessed, in parallel, from each memory block portion 1101, 1104 and 1107 across all memory devices of the memory module, as all of these memory block portions belong to one memory block associated with the memory block address MA1. However, since the memory block portion 1104 contains a defective memory location 1121, the entire memory block associated with the memory block address MA1 may be excluded from a usable memory map and thus, all memory block portions 1101, 1104 and 1107 that belong to that memory block may be excluded from use.

Similarly, when access to any memory cell located in the memory block associated with memory block address MA2 is attempted, data will actually be accessed, in parallel, from each memory block portion 1102, 1105, and 1108 across all memory devices of the memory module, as all of these memory block portions belong to one memory block associated with the memory block address MA2. However, due to the presence of defective memory location 1111 in the memory block portion 1102, all memory block portions 1102, 1105, and 1108 that belong to that memory block may be excluded from a usable memory map.

When access to any memory cell located in the memory block associated with memory block address MA3 is attempted, data will actually be accessed, in parallel, from each memory block portion 1103, 1106, and 1109 across all memory devices of the memory module, as all of these memory block portions belong to one memory block associated with the memory block address MA3. However, all memory block portions 1103, 1106 and 1109 that belong to that memory block may be excluded from a usable memory map because there is a defective memory location 1131 in the memory block portion 1109.

In contrast, in accordance with at least one embodiment described herein, FIG. 11*b* depicts a memory module 1150 assembled from at least three tested memory modules, MD1' 1160, MD2' 1170 and MD3' 1180. The general structure of the memory module in FIG. 11*b* is similar to that of FIG. 11*a*. Specifically, each tested memory device MD1', MD2' and MD3' is shown to have three memory block portions, namely the memory block portions 1151, 1152 and 1153 of MD1', the memory block portions 1154, 1155 and 1156 of MD2' and the memory block portions 1157, 1158 and 1159 of MD3'. Moreover, each individual memory block portion belongs to one of three different memory blocks, and each of the three memory blocks are associated with a different memory block address, namely MA1, MA2 or MA3.

However, unlike the defective memory locations 1111, 1121 and 1131 shown in FIG. 11*a* that were distributed (e.g., randomly) among different memory blocks associated with different memory block addresses, the defective memory locations 1161, 1171 and 1181 in FIG. 11*b* are all located within the same memory block associated with one particular memory block address MA2.

To achieve this result, in accordance with at least one embodiment described herein, tested memory devices may be uniquely selected, specifically based on the defective memory locations identified for those devices, when assembling a memory module. The selection allows for a particular arrangement of memory devices within a memory module such that different defective memory locations across multiple memory devices will be located within one or more of the same memory blocks, as illustrated in FIG. 11*b* by way of example.

In that example, each of MD1', MD2' and MD3' was tested by the testing process performed by the tester 410 as described herein, and determined to have one or more defective memory locations. The three tested memory devices were then specifically grouped together and used to assemble memory module 1150, because each of the tested memory devices MD1', MD2' and MD3' was determined to comprise a defective memory location 1161, 1171, and 1181 in memory block portions 1152, 1155, and 1158 located in one memory block associated with one specific memory block address, MA2.

In another example implementation, the tested memory devices MD1', MD2' and MD3' may have been first sorted based on the number of defective memory locations (e.g., each had one defective memory location), and then further sorted based on the specific memory block in which the defective memory location for the given memory device would be located. The further sorting may be done just prior to assembling the memory module, if desired.

Referring again to FIG. 11*b*, when access to any memory cell located in the memory block associated with memory block address MA1 is attempted, data will be accessed from memory block portions 1151, 1154 and 1157. Since there are no defective memory locations in any of these memory block portions, all of memory block portions 1151, 1154, 1157 (i.e., the memory block as a whole) will typically be included in a usable memory map. Similarly, the memory block portions 1153, 1156 and 1159 that belong to a memory block associated with memory block address MA3 will also be typically included in the usable memory map because there are no defective memory locations in any of these memory block portions. The memory block portions 1152, 1155 and 1158, which belong to a memory block that corresponds to the memory block address MA2, however, may be excluded from the usable memory map because at least one of memory block portions 1152, 1155 and 1158 contains a defective memory location.

By judicially selecting memory devices in the assembly of a memory module, the number of memory blocks that may ultimately be included in a usable memory map may be increased. As illustrated by FIGS. 11*a* and 11*b*, although each of the memory modules 1100 and 1150, respectively, contain memory devices with one defective memory location, the amount of memory that will actually be made available for use can vary significantly depending on where a defective memory location is located on each individual memory device. In the example of FIG. 11*a*, nine memory block portions 1101, 1102, 1103, 1104, 1105, 1106, 1107, 1108, and 1109 (i.e., three whole memory blocks) were excluded from usable memory, whereas in the example of FIG. 11*b*, only three memory block portions 1152, 1155 and 1158 (i.e., only whole one memory block) need be excluded from usable memory.

It will be understood by a person skilled in the art that the structure of memory devices depicted in FIGS. 11*a* and 11*b* is shown for illustrative purposes. The number of memory block portions in each memory device may be greater or fewer than as shown, in variant implementations. The number of individual memory locations (e.g., cells) in each memory block will typically be greater than as depicted, but may be fewer in variant implementations.

It will also be understood that in certain architectures, a memory block may comprise multiple memory block portions (e.g., multiple rows of memory cells) on the same memory device. Determining whether a given memory block may contain a defective memory location would then generally require a determination of whether any of the multiple memory block portions (or rows of memory cells) on a given memory device contain a memory defective memory location, and then repeating this act for each other memory device in the memory module containing portions of the same given memory block.

Note that when selecting memory devices for assembly into memory modules such that defective memory locations are located in the same memory block (or in the same group of neighbouring memory blocks), knowledge of the relevant architecture is typically required. For example, defective memory locations can exist in the first and third rows of memory cells on a given memory device. Then, when these individual rows of memory cells are associated with different memory blocks (in this example, two different memory blocks are affected) or these rows of memory cells are associated with one memory block (in this example, the first and third rows of memory cells could be associated with a single memory block), it may influence the selection of the memory devices for the assembly of a memory module.

Figure 12:
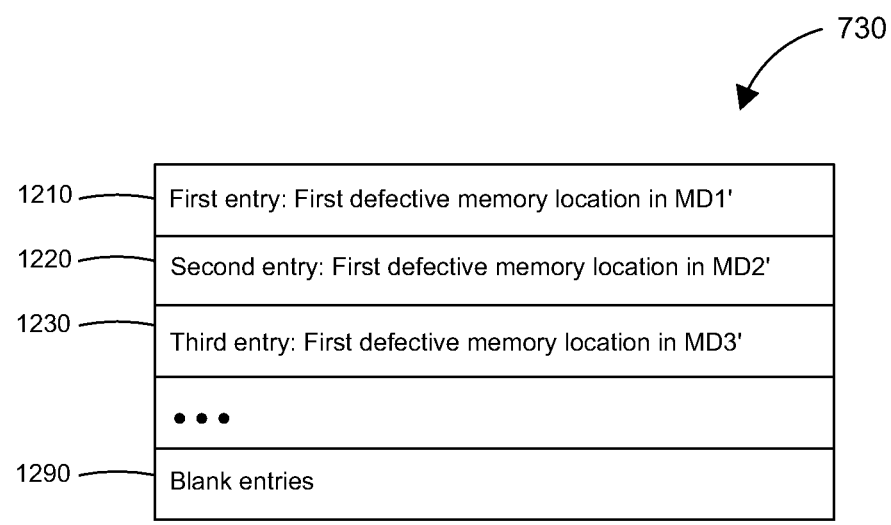
FIG. 12 illustrates data identifying defective memory locations in tested memory devices as stored in a persistent store in accordance with another example embodiment.

FIG. 12 illustrates data identifying defective memory locations in tested memory devices stored in persistent store 730, in association with the example memory module 1150 of FIG. 11*b*. In this example, the defective memory locations on each of the three illustrated tested memory devices have a defective memory location within a memory block associated with the memory block address MA2. The memory module may be assembled by retrieving three tested memory devices from a bin designated for tested memory devices with defective memory locations within a memory block associated with the memory block address MA2. The corresponding data identifying defective memory locations in tested memory devices that may be stored in the persistent store 730 (not explicitly shown in FIG. 11*b*) of the assembled memory module 1150 may comprise a first entry 1210 identifying a first defective memory location 1161 (FIG. 11*b*) in the first tested memory device MD1' 1160 (FIG. 11*b*), a second entry 1220 identifying a first defective memory location 1171 (FIG. 11 *b*) in the second tested memory device MD2' 1170 (FIG. 11*b*), and a third entry 1230 identifying a first defective memory location 1181 (FIG. 11*b*) in the third tested memory device MD3' 1180 (FIG. 11*b*).

In some embodiments, after testing the assembled memory module 1150, the records in the persistent store 730 may be simplified by removing two of the three entries 1210, 1220, 1230 since they refer to the same memory block associated with the same memory block address MA2, recognizing that the entire memory block may be excluded from usable memory if any one of the three entries 1210, 1220, 1230 exists in the persistent store 730. However, it may be desirable to keep all three entries in the persistent store, particularly if one wishes to maintain information about the defective memory locations on each individual memory device for some future use.

It will be understood that the data identifying defective memory locations in tested memory devices as stored in the persistent store 730 may further include entries identifying any defective memory locations on any other memory devices that may be on the assembled memory module 1150, and may further include one or more blank entries 1290, updateable to store data associated with additional defective memory locations that are later discovered and identified. Other data associated with the tested memory devices on the assembled memory module 1150, as previously noted for example, may also be stored in the persistent store 730.

It will also be understood from the examples above that in at least one embodiment, a memory module may be assembled from at least one memory device having no defective memory locations.

Figure 13:
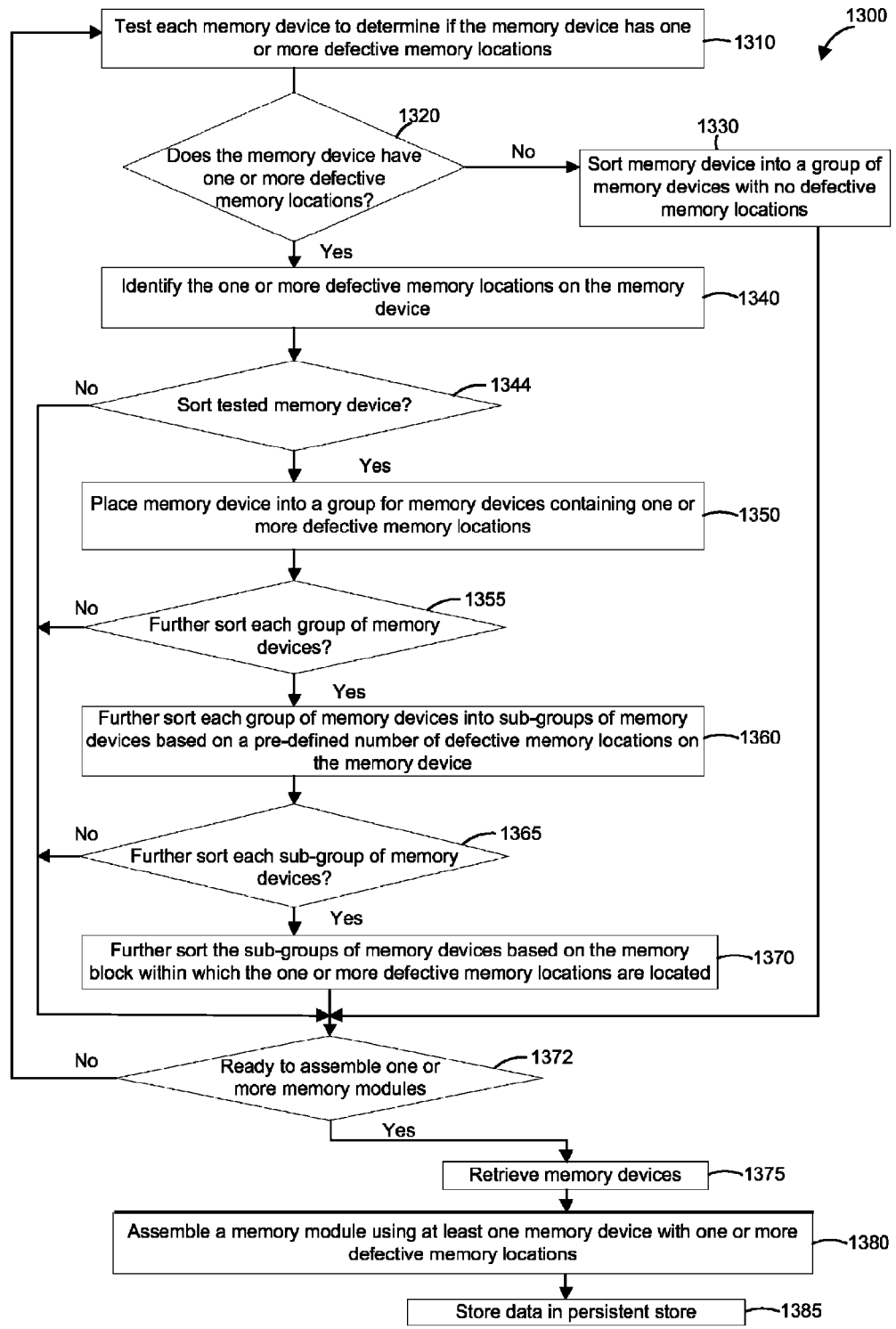
FIG. 13 is a flowchart illustrating acts performed in a method of testing and assembling a memory module in accordance with at least one example embodiment.

Referring now to FIG. 13, there is provided a flowchart of a method of testing and assembling a memory module shown generally as 1300, in accordance with at least one embodiment. Some features associated with various acts described in method 1300 have been previously described with reference to earlier Figures, and the reader is directed to the earlier parts of the description for further details.

At 1310, for each of a plurality of memory devices, a tester (e.g. tester 410 of FIG. 4) tests the memory device to determine if the memory device has one or more defective memory locations.

At 1320, for each of the plurality of memory devices, based on results of the testing performed at 1310, it is determined whether the memory device comprises one or more defective memory locations.

If it is determined that the given memory device does not have any defective memory locations, then at 1330, a handler (e.g., handler 415 of FIG. 4) sorts the memory device into a group of memory devices having no defective memory locations. Data indicating that the tested memory device has no defective memory locations may be stored in a database (e.g., database 405 of FIG. 4). The storage of this data into the database may take place, for example, immediately after the memory device has been tested, after the memory device is sorted into a group, after the memory device is assembled onto a memory module, or at some other time as determined by a test engineer or other individual.

On the other hand, if it is determined that the memory device does comprise one or more defective memory locations, then at 1340, the one or more defective memory locations on the memory device are identified, and corresponding data identifying the one or more defective memory locations on the memory device is generated. Data identifying the one or more defective memory locations on the memory device may be stored in the database. The storage of this data into the database may take place, for example, immediately after the memory device has been tested, after the memory device is optionally sorted, after the memory device is assembled onto a memory module, or at some other time as determined by a test engineer or other individual.

After a memory device has undergone testing and it is determined that the memory device has one or more defective memory locations, the handler may sort or place the tested memory device into a group or "bin", if sorting is desired as determined at 1344. If sorting of the memory device is desired, the handler will sort the memory device by placing the memory device with a group for devices containing one or more defective memory locations at 1350. Otherwise, the flow of the method may proceed directly to 1372.

After the handler places the memory device into a group, it is determined at 1355 whether further sorting of the group of memory devices is to be performed. If further sorting of the group is to be performed, the handler may further sort the memory devices in the group into sub-groups based on a pre-defined number(s) of defective memory locations on the memory devices at 1360. Otherwise, the flow of the method may proceed directly to 1372.

After the handler further sorts memory devices at 1360, it is determined at 1365 whether further sorting based on the defective memory location is to be performed. If further sorting of the group is to be performed, the handler may further sort the memory devices based on the memory block within which the one or more defective memory locations will be located at 1370. Otherwise, the flow of the method may proceed directly to 1372.

At 1372, it is determined whether assembly of memory modules is to commence. If so, the assembling unit proceeds to retrieve memory devices at 1375. Otherwise, the tester may continue to test individual memory devices, and the flow of the method proceeds back to 1310.

It will be understood by persons skilled in the art that a given act of sorting memory devices (e.g. 1350, 1360 and 1370) can be performed without the preceding act or acts taking place, in combination with each other in a different order (e.g. 1350 then 1370, or 1370 before 1360), or the act of sorting may not be performed at all. For example, it will be understood that 1350 may not be performed if either the sorting at 1360 or 1370 is first performed, because the sorting at 1360 or 1370 may implicitly sort memory devices into groups of memory devices having one or more defective memory locations. As a further example, the handler may place a tested memory device directly into a bin containing defective memory locations in a particular memory block (e.g., as at 1370) without performing any other pre-sorting. This may conserve resources, particularly where operations of the handler are to be generally minimized.

In some embodiments, no acts of sorting memory devices at all are performed prior to the memory devices being assembled into memory modules, after the memory devices have been tested. The tested memory devices may all be placed together into a storage unit, and stored and indexed (e.g., by a device ID) in such a way that allows an individual device to be later located and retrieved from the storage unit for assembly or for some other purpose.

At 1375, one or more tested memory devices are located (e.g., from particular groups or bins, or some other storage unit) and retrieved for assembly into memory modules.

At 1380, a memory module (see e.g. FIGS. 7 and 11b) is assembled using at least one tested memory device having one or more defective memory locations.

At 1385, for each tested memory device assembled in the memory module having one or more defective memory locations, data that identifies the one or more defective memory locations on the memory device is stored in a persistent store on the memory module.

Although not explicitly shown in FIG. 13, memory modules assembled at 1380 may then be tested again. The subsequent testing of assembled memory modules may be performed using the same tester and/or handler used in the testing of the individual memory devices, or using a different tester and/or handler, as desired. As assembled memory modules may be more easily handled than individual memory devices due to the larger size of the memory modules, the aid of a mechanical handling device may not be required to move memory modules to and from the tester and/or bins or other storage units.

In variant embodiments, data to be stored in a persistent store of a memory module may be stored therein directly during testing without first being stored or being additionally stored in a database. In variant embodiments, data associated with tested memory devices assembled on a memory module may be additionally or alternatively stored in a database that is used to store characteristics of assembled memory modules.

The embodiments described herein have been shown and described by way of a number of examples. It will be apparent to those skilled in the art that changes and modifications to the described embodiments may be made without departing from the substance and scope of the described embodiments, as defined in the appended claims.

The invention claimed is:

1. A method of assembling memory modules, the method comprising:
   for each memory device of a plurality of memory devices, based on testing performed on the memory device,
     determining whether the memory device has any defective memory locations, and
     if the memory device has one or more defective memory locations, identifying the one or more defective memory locations, and generating data that identifies the one or more defective memory locations on the memory device;
   selecting, from the plurality of memory devices, at least one memory device having one or more defective memory locations, for assembly into a memory module; and
   in response to the selecting, assembling the memory module using at least the selected at least one memory device having one or more defective memory locations;
   wherein the assembling comprises, for each memory device having one or more defective memory locations, storing the data that identifies the one or more defective memory locations on the memory device in a persistent store on the memory module; and
   wherein the selecting comprises selecting the at least one memory device based on where the defective memory locations are located on each of the at least one memory device.

2. The method of claim 1, wherein for each of the at least one memory device, the memory device is selected for assembly into the memory module if at least one of the defective memory locations on the memory device, and at least one of the defective memory locations on at least one different memory device of the at least one memory device, will belong to a same at least one memory block of the memory module after assembly of the memory module.

3. The method of claim 1, wherein the persistent store on the memory module comprises a serial presence detect module.

4. The method of claim 1, further comprising:
   storing, for each memory device having one or more defective memory locations, the data that identifies the one or more defective memory locations on the memory device in a database; and
   retrieving, for each memory device of the memory module having one or more defective memory locations, the data that identifies the one or more defective memory locations on the memory device, from the database for storing in the persistent store on the memory module.

5. The method of claim 1, further comprising:
   generating, for each memory device of the plurality of memory devices, data that identifies details associated with the testing performed on the memory device;

wherein the assembling further comprises storing the data that identifies details associated with the testing performed on the memory device in the persistent store on the memory module.

6. The method of claim 5, further comprising:
storing, for each memory device of the plurality of memory devices, the data that identifies the details associated with the testing performed on the memory device in a database; and
retrieving, for each memory device of the memory module having one or more defective memory locations, the data that identifies the details associated with the testing performed on the memory device, from the database for storing in the persistent store on the memory module.

7. The method of claim 5, wherein the details associated with the testing performed on the memory device comprise an identification of a test pattern that caused a failure of the memory device.

8. The method of claim 1, wherein the memory module comprises at least one memory device having no defective memory locations.

9. The method of claim 1, wherein each memory device of the memory module comprises the same number of defective memory locations.

10. The method of claim 9, wherein each memory device of the memory module comprises exactly one defective memory location.

11. The method of claim 1, wherein the memory module comprises eight memory devices.

12. The method of claim 11, wherein the plurality of memory devices comprises eight or less defective memory locations, in total, amongst the plurality of memory devices.

13. The method of claim 1, further comprising testing each of the plurality of memory devices, wherein test vector patterns are utilized in the testing to determine defective memory locations on each of the plurality of memory devices.

14. The method of claim 1, further comprising retrieving the plurality of memory devices from a pool of tested memory devices.

15. The method of claim 14, further comprising sorting the plurality of memory devices into at least two groups prior to the retrieving, wherein memory devices having no defective memory locations are separated from the memory devices having one or more defective memory locations.

16. The method of claim 15, wherein the sorting comprises separating the memory devices having one or more defective memory locations into at least one group associated with a pre-defined number of defective memory locations.

17. The method of claim 15, wherein the sorting comprises separating the memory devices having a number of defective memory locations greater than a threshold value into a group, and wherein memory devices having the number of defective memory locations greater than the threshold value are not used for assembling the memory module.

18. The method of claim 15, wherein the sorting is performed with aid from a robotic device.

19. The method of claim 14, wherein the plurality of memory devices are selected from the pool of tested memory devices, such that all of the defective memory locations on the plurality of memory devices are located in a same at least one memory block.

20. The method of claim 19, wherein the same at least one memory block is associated with at least one memory block address.

21. A system for testing and assembling memory modules, the system comprising:
a tester, wherein the tester comprises a processor;
wherein the processor is configured to, for each memory device of a plurality of memory devices, based on testing performed on the memory device, determine whether the memory device has any defective memory locations;
wherein the processor is further configured to, if the memory device has one or more defective memory locations, identify the one or more defective memory locations, and generate data that identifies the one or more defective memory locations on the memory device;
wherein the system is configured to select, from the plurality of memory devices, at least one memory device having one or more defective memory locations, for assembly into a memory module, based on where the defective memory locations are located on each of the at least one memory device;
wherein the system is further configured to, in response to selecting the at least one memory device having one or more defective memory locations, assemble the memory module using at least the selected at least one memory device having one or more defective memory locations; and
wherein the system is further configured to store, for each memory device having one or more defective memory locations, the data that identifies the one or more defective memory locations on the memory device in a persistent store on the memory module.

22. A method of assembling memory modules, the method comprising:
for each memory device of a plurality of memory devices, based on testing performed on the memory device, determining whether the memory device has any defective memory locations, and
if the memory device has one or more defective memory locations, identifying the one or more defective memory locations, and generating data that identifies the one or more defective memory locations on the memory device;
selecting, from the plurality of memory devices, at least one memory device having one or more defective memory locations, for assembly into a memory module; and
in response to the selecting, assembling the memory module using at least the selected at least one memory device having one or more defective memory locations;
wherein the assembling comprises, for each memory device having one or more defective memory locations, storing the data that identifies the one or more defective memory locations on the memory device in a persistent store on the memory module; and
wherein each memory device of the memory module comprises the same number of defective memory locations.

23. The method of claim 22, wherein each memory device of the memory module comprises exactly one defective memory location.

24. A system for testing and assembling memory modules, the system comprising:
a tester, wherein the tester comprises a processor;
wherein the processor is configured to, for each memory device of a plurality of memory devices, based on testing performed on the memory device, determine whether the memory device has any defective memory locations;
wherein the processor is further configured to, if the memory device has one or more defective memory locations, identify the one or more defective memory locations, and generate data that identifies the one or more defective memory locations on the memory device;

wherein the system is configured to select, from the plurality of memory devices, at least one memory device having one or more defective memory locations, for assembly into a memory module;

wherein the system is further configured to, in response to selecting the at least one memory device having one or more defective memory locations, assemble the memory module using at least the selected at least one memory device having one or more defective memory locations;

wherein the system is configured to store, for each memory device having one or more defective memory locations, the data that identifies the one or more defective memory locations on the memory device in a persistent store on the memory module; and wherein each memory device of the memory module comprises the same number of defective memory locations.

25. A method of assembling memory modules, the method comprising:

for each memory device of a plurality of memory devices,
based on testing performed on the memory device,
determining whether the memory device has any defective memory locations, and
if the memory device has one or more defective memory locations, identifying the one or more defective memory locations, and generating data that identifies the one or more defective memory locations on the memory device;

selecting, from the plurality of memory devices, at least one memory device having one or more defective memory locations, for assembly into a memory module; and in response to the selecting, assembling the memory module using at least the selected at least one memory device having one or more defective memory locations;

wherein the assembling comprises, for each memory device having one or more defective memory locations, storing the data that identifies the one or more defective memory locations on the memory device in a persistent store on the memory module; and wherein the method further comprises selecting the plurality of memory devices from a pool of tested memory devices, such that all of the defective memory locations on the plurality of memory devices are located in a same at least one memory block.

26. The method of claim 25, wherein the same at least one memory block is associated with at least one memory block address.

27. A system for testing and assembling memory modules, the system comprising:

a tester, wherein the tester comprises a processor;

wherein the processor is configured to, for each memory device of a plurality of memory devices, based on testing performed on the memory device, determine whether the memory device has any defective memory locations;

wherein the processor is further configured to, if the memory device has one or more defective memory locations, identify the one or more defective memory locations, and generate data that identifies the one or more defective memory locations on the memory device;

wherein the system is configured to select, from the plurality of memory devices, at least one memory device having one or more defective memory locations, for assembly into a memory module;

wherein the system is further configured to, in response to selecting the at least one memory device having one or more defective memory locations, assemble the memory module using at least the selected at least one memory device having one or more defective memory locations;

wherein the system is configured to store, for each memory device having one or more defective memory locations, the data that identifies the one or more defective memory locations on the memory device in a persistent store on the memory module; and wherein the system is further configured to select the plurality of memory devices from a pool of tested memory devices, such that all of the defective memory locations on the plurality of memory devices are located in a same at least one memory block.

\* \* \* \* \*